(12) United States Patent
Lee et al.

(10) Patent No.: US 12,707,873 B2
(45) Date of Patent: Aug. 11, 2026

(54) DISPLAY APPARATUS HAVING METAL STACK BETWEEN EMISSION AREAS AND METHOD OF PROVIDING THE SAME

(71) Applicant: Samsung Display Co., Ltd., Yongin-si (KR)

(72) Inventors: Jeongseok Lee, Yongin-si (KR); Taewook Kang, Yongin-si (KR); Wooyong Sung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 550 days.

(21) Appl. No.: 18/326,438

(22) Filed: May 31, 2023

(65) Prior Publication Data

US 2024/0065081 A1 Feb. 22, 2024

(30) Foreign Application Priority Data

Aug. 18, 2022 (KR) ........................ 10-2022-0103342

(51) Int. Cl.
*H10K 59/80* (2023.01)
*H10K 59/12* (2023.01)
*H10K 59/122* (2023.01)

(52) U.S. Cl.
CPC ..... *H10K 59/8792* (2023.02); *H10K 59/1201* (2023.02); *H10K 59/122* (2023.02)

(58) Field of Classification Search
CPC .................................................. H10K 59/8792
See application file for complete search history.

(56) References Cited

U.S. PATENT DOCUMENTS 9,236,581 B2 1/2016 Kato et al.
9,614,168 B2 4/2017 Zhang et al.
9,735,213 B2 8/2017 Yang
11,145,700 B2 10/2021 Choi et al.
(Continued)

FOREIGN PATENT DOCUMENTS

CN 111370592 A 7/2020
CN 112103326 A 12/2020
(Continued)

OTHER PUBLICATIONS

European Search Report for European Patent Application No. 23191522.4 dated Jan. 5, 2024.

*Primary Examiner* — Peter Bradford
(74) *Attorney, Agent, or Firm* — CANTOR COLBURN LLP

(57) ABSTRACT

A display apparatus includes a thin-film transistor on a substrate, a planarization film on the thin-film transistor, a light-emitting element on the planarization film, connected to the thin-film transistor, and including a first electrode, an intermediate layer and a second electrode in order from the thin-film transistor, an insulating layer overlapping an edge of the first electrode, a metal stacked structure on the insulating layer, including a first sub-metal layer and a second sub-metal layer which is closer to the insulating layer than the first sub-metal layer, and a low reflection layer located on the metal stacked structure. The second electrode includes a first portion on the intermediate layer, and a second portion which is on the reflection layer and disconnected from the first portion at the metal stacked structure.

18 Claims, 16 Drawing Sheets

(56) References Cited

U.S. PATENT DOCUMENTS

| | | | | |
|---|---|---|---|---|
| 2016/0181334 | A1* | 6/2016 | Yang ..................... | H10D 86/60<br>438/23 |
| 2017/0309833 | A1* | 10/2017 | Lei ........................ | H10K 50/17 |
| 2018/0097034 | A1* | 4/2018 | Lee ..................... | H01L 23/3142 |
| 2018/0151642 | A1* | 5/2018 | Oh ..................... | H10K 59/8731 |
| 2020/0168823 | A1* | 5/2020 | Kim ..................... | H10K 59/122 |
| 2021/0043870 | A1 | 2/2021 | Baek et al. | |
| 2022/0093894 | A1 | 3/2022 | Song et al. | |
| 2022/0181413 | A1* | 6/2022 | Lee ...................... | H10K 59/124 |
| 2022/0208943 | A1 | 6/2022 | Aoki et al. | |
| 2022/0271115 | A1* | 8/2022 | Harada ................ | H10K 59/122 |
| 2023/0320142 | A1* | 10/2023 | Mizukoshi ......... | H10K 59/1201<br>257/40 |

FOREIGN PATENT DOCUMENTS

| | | | | | |
|---|---|---|---|---|---|
| JP | 2008135325 | A | * | 6/2008 | ....... H10K 59/80522 |
| JP | 2022102401 | A | | 7/2022 | |
| KR | 100846599 | B1 | | 7/2008 | |
| KR | 1020160053043 | A | | 5/2016 | |
| KR | 20170139957 | A | * | 12/2017 | ............ H10K 71/40 |
| KR | 20210018641 | A | | 2/2021 | |
| KR | 1020210130781 | A | | 11/2021 | |

* cited by examiner

DISPLAY APPARATUS HAVING METAL STACK BETWEEN EMISSION AREAS AND METHOD OF PROVIDING THE SAME

This application claims priority to Korean Patent Application No. 10-2022-0103342, filed on Aug. 18, 2022, and all the benefits accruing therefrom under 35 U.S.C. § 119, the disclosure of which is incorporated by reference herein in its entirety.

BACKGROUND

1. Field

One or more embodiments relate to a structure of a display apparatus.

2. Description of the Related Art

Display apparatuses visually display data. A display apparatus may include a substrate divided into a display area and a peripheral area. In the display area, a scan line and a data line may be formed to be insulated from each other, and a plurality of pixels may be included. Also, in the display area, a thin-film transistor corresponding to each of the pixels and a sub-pixel electrode which is electrically connected to the thin-film transistor may be provided. Also, in the display area, a counter electrode commonly provided over the pixels may be provided. In the peripheral area, various wirings for transmitting electrical signals to the display area, a scan driver, a data driver, a controller, a pad unit, etc. may be provided.

Display apparatuses have been used for various purposes. Accordingly, various designs have been attempted to improve the quality of display apparatuses.

SUMMARY

One or more embodiments include a display apparatus in which a high-quality image may be provided by preventing growth of dark spots and a reflectance of external light may be reduced. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display apparatus includes a substrate, at least one thin-film transistor formed (or provided) on the substrate, a planarization film on the at least one thin-film transistor, a first electrode formed on the planarization film and electrically connected to the thin-film transistor, a first insulating layer covering an edge of the first electrode and extending to a non-pixel area, a metal stacked structure located on the first insulating layer, and including a first sub-metal layer and a second sub-metal layer located under the first sub-metal layer, a low-reflection layer located on the metal stacked structure, an intermediate layer located on the first electrode, and a second electrode including a first portion located on the intermediate layer and a second electrode including a second portion located on the low-reflection layer. The first portion of the second electrode and the second portion of the second electrode are separated from each other by the metal stacked structure.

The first portion of the second electrode may be electrically connected to the second sub-metal layer of the metal stacked structure.

The first sub-metal layer and the second sub-metal layer of the metal stacked structure may include metals having different etch rates from each other. The first sub-metal layer may include a first hole overlapping the first electrode, and the second sub-metal layer may include a second hole having a diameter greater than a diameter of the first hole and overlapping the first hole.

An edge of the first sub-metal layer defining the first hole may protrude from a point at which a side surface of the second sub-metal layer defining the second hole and a bottom surface of the first sub-metal layer meet each other, to a center of the first hole.

The first portion of the second electrode may contact the side surface of the second sub-metal layer.

The low-reflection layer may include a metal oxide having a surface reflectance lower than a surface reflectance of the first sub-metal layer.

The low-reflection layer may include at least one of copper oxide (CuO), calcium oxide (CaO), molybdenum oxide (MoOx), and zinc oxide (ZnO).

The display apparatus may further include a bank layer located between the low-reflection layer and the second portion of the second electrode.

The display apparatus may further include a first protective layer located between the first electrode and the first insulating layer.

The first protective layer may include a transparent conductive oxide (TCO).

The display apparatus may further include a thin-film encapsulation layer located on the second portion of the second electrode.

The thin-film encapsulation layer may include a first inorganic encapsulation layer, an organic encapsulation layer, and a second inorganic encapsulation layer. The first inorganic encapsulation layer may continuously extend along the second portion of the second electrode, a side surface of the metal stacked structure, and a top surface of the first portion of the second electrode, the organic encapsulation layer may at least partially fill the first hole and the second hole, and the second inorganic encapsulation layer may be located on the organic encapsulation layer.

The first inorganic encapsulation layer and the second inorganic encapsulation layer may contact each other, on the metal stacked structure.

According to one or more embodiments, a method of manufacturing (or providing) a display apparatus includes forming at least one thin-film transistor on a substrate, forming a planarization film on the thin-film transistor, forming, on the planarization film, a first electrode electrically connected to the thin-film transistor, forming a first insulating layer overlapping an edge of the first electrode, forming a metal stacked structure on the first insulating layer, forming a low-reflection layer on the metal stacked structure, forming an intermediate layer on the first electrode, and forming a second electrode on the intermediate layer. The second electrode includes a first portion overlapping the first electrode and the intermediate layer, and a second portion on the low-reflection layer. The first portion of the second electrode and the second portion of the second electrode may be separated from each other by the metal stacked structure.

The method may further include forming a bank layer between the low-reflection layer and the second portion of the second electrode.

The forming of the metal stacked structure may include forming a first sub-metal layer and a second sub-metal layer that is located under the first sub-metal layer, forming, in the first sub-metal layer, a first hole overlapping the first electrode, and forming, in the second sub-metal layer, a second hole having a diameter greater than a diameter of the first hole and overlapping the first hole.

An edge of the first sub-metal layer defining the first hole may protrude from a point at which a side surface of the second sub-metal layer defining the second hole and a bottom surface of the first sub-metal layer meet each other, to a center of the first hole.

The method may further include forming, in the first insulating layer, a hole overlapping the first hole.

The method may further include forming a first protective layer between the first insulating layer and the first electrode, and forming, in the first protective layer, a hole overlapping the first hole.

The method may further include forming a thin-film encapsulation layer on the second portion of the second electrode. The forming of the thin-film encapsulation layer may include forming a first inorganic encapsulation layer along the second portion of the second electrode, a side surface of the metal stacked structure and a top surface of the first portion of the second electrode, forming an organic encapsulation layer at least partially filling the first hole and the second hole, and forming a second inorganic encapsulation layer on the organic encapsulation layer, and contacting the first inorganic encapsulation layer on a top surface of the metal stacked structure.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
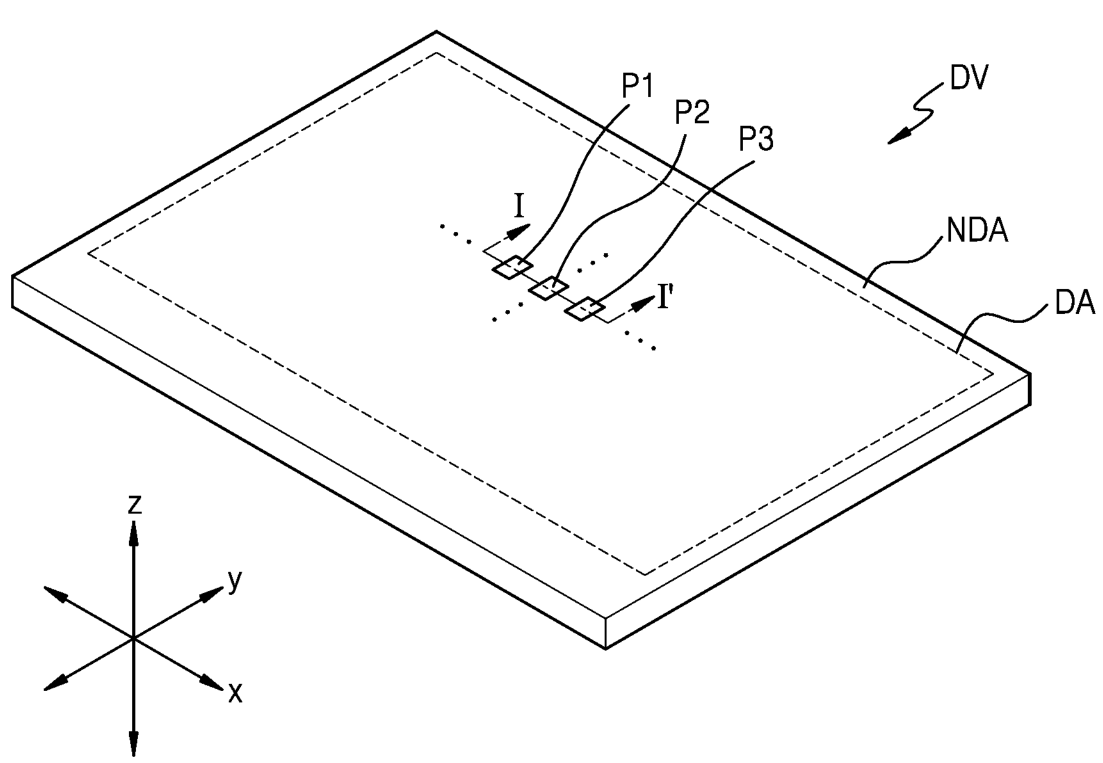
FIG. 1 is a perspective view schematically illustrating a display apparatus, according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Reference will now be made in detail to embodiments, examples of which are illustrated in the accompanying drawings, and in the drawings, the same elements are denoted by the same reference numerals, and thus a repeated description thereof will be omitted. For example, a reference number labeling a singular form of an element within the drawing figures may be used to reference a plurality of the singular element within the text of specification.

Although the terms "first," "second," etc. may be used to describe various elements, these elements should not be limited by these terms. These terms are only used to distinguish one element from another.

The terminology used herein is for the purpose of describing particular embodiments only and is not intended to be limiting. As used herein, the singular forms "a," "an," and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or."

It will be further understood that the terms "comprises" or "comprising" used herein specify the presence of stated features or components, but do not preclude the presence or addition of one or more other features or components.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

It will be further understood that, when a layer, region, or component is referred to as being related to another element such as being "on" another layer, region, or component, it may be directly on the other layer, region, or component, or may be indirectly on the other layer, region, or component with intervening layers, regions, or components therebetween.

Sizes of components in the drawings may be exaggerated or contracted for convenience of explanation. For example, because sizes and thicknesses of elements in the drawings are arbitrarily illustrated for convenience of explanation, the disclosure is not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When a certain embodiment may be implemented differently, a specific process order may be different from the described order. For example, two consecutively described processes may be performed substantially at the same time or may be performed in an order opposite to the described order.

It will be understood that when a layer, region, or component is referred to as being related to another element such as being "connected," the layer, the region, or the component may be directly connected or may be indirectly connected with intervening layers, regions, or components therebetween. For example, when layers, regions, or components are referred to as being "electrically connected," the layers, the regions, or the components may be directly electrically connected, or may be indirectly electrically connected with intervening layers, regions, or components therebetween. In contrast, when a layer, region, or component is referred to as being related to another element such as being "directly connected" or "directly on" the layer, no intervening layer, region, or component is disposed therebetween.

FIG. 1 is a perspective view schematically illustrating a display apparatus DV, according to an embodiment.

Referring to FIG. 1, a display apparatus DV may include a display area DA and a non-display area NDA which is outside the display area DA. The display apparatus DV may provide an image through an array of sub-pixels that are two-dimensionally arranged in an x-y plane. The sub-pixels may be arranged within the display area DA, without being limited thereto. The plurality of sub-pixels include a first sub-pixel P1, a second sub-pixel P2, and a third sub-pixel P3, and the following will be described for convenience of explanation assuming that the first sub-pixel P1 is a red sub-pixel, the second sub-pixel P2 is a green sub-pixel, and the third sub-pixel P3 is a blue sub-pixel.

The red sub-pixel, the green sub-pixel, and the blue sub-pixel are areas where red light, green light, and blue light may be respectively emitted, and the display apparatus DV, may provide an image by using light emitted from the sub-pixels.

The non-display area NDA where an image is not provided may entirely surround the display area DA (e.g., may surround an entirety of the display area DA), in the plan view (e.g., a view of the x-y plane along the z-direction). A driver or a main voltage supply line for providing an electrical signal or power to pixel circuits PC connected to the sub-pixels, may be located in the non-display area NDA. A pad to which an electronic device or a printed circuit board may be electrically connected may be included in the non-display area NDA. That is, the electronic device or printed circuit board may be connected to the display apparatus DV, at the pad and/or at the non-display area NDA.

The display area DA may have a planar shape such as any of polygonal shapes including a quadrangular shape as shown in FIG. 1. That is, the display area DA may have a rectangular shape in which a horizontal length (e.g., along the x-direction or first direction) is greater than a vertical length (e.g., along the y-direction or second direction crossing the first direction), a rectangular shape in which a horizontal length is less than a vertical length, or a square shape. Alternatively, the display area DA may have an elliptical shape or a circular shape. A thickness of the display apparatus DV and/or various components or layers thereof, may be defined along a third direction (e.g., the z-direction).

The display apparatus DV may be applied to any of various products such as a television, a laptop computer, a monitor, an advertisement board, or an Internet of things (IoT) product as well as a portable electronic device such as a mobile phone, a smartphone, a tablet personal computer (PC), a mobile communication terminal, an electronic organizer, an electronic book, a portable multimedia player (PMP), a navigation device, or an ultra-mobile PC (UMPC). Also, the display apparatus DV according to an embodiment may be applied to a wearable device such as a smart watch, a watch phone, a glasses-type display, or a head-mounted display (HMD). Also, the display apparatus DV according to an embodiment may be applied to a center information display (CID) located on an instrument panel, a center fascia, or a dashboard of a vehicle, a room mirror display replacing a side-view mirror of a vehicle, or a display screen located on the back of a front seat for entertainment for a back seat of a vehicle.

Figure 2A:
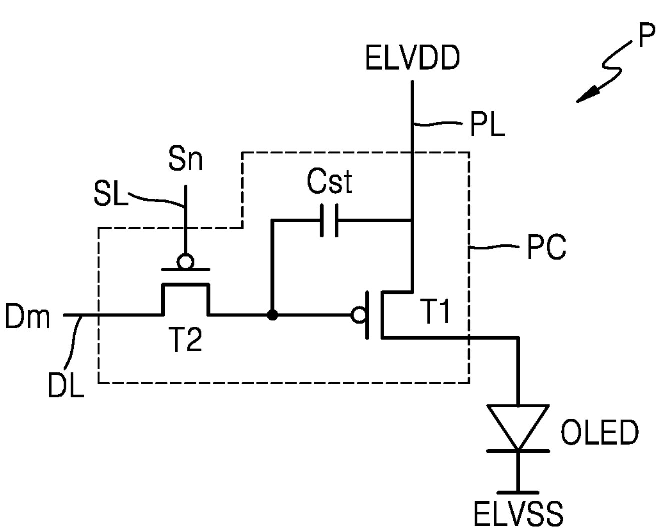
FIGS. 2A and 2B are equivalent circuit diagrams illustrating a light-emitting diode included in a display apparatus and a pixel circuit electrically connected to the light-emitting diode, according to an embodiment.
Figure 2B:
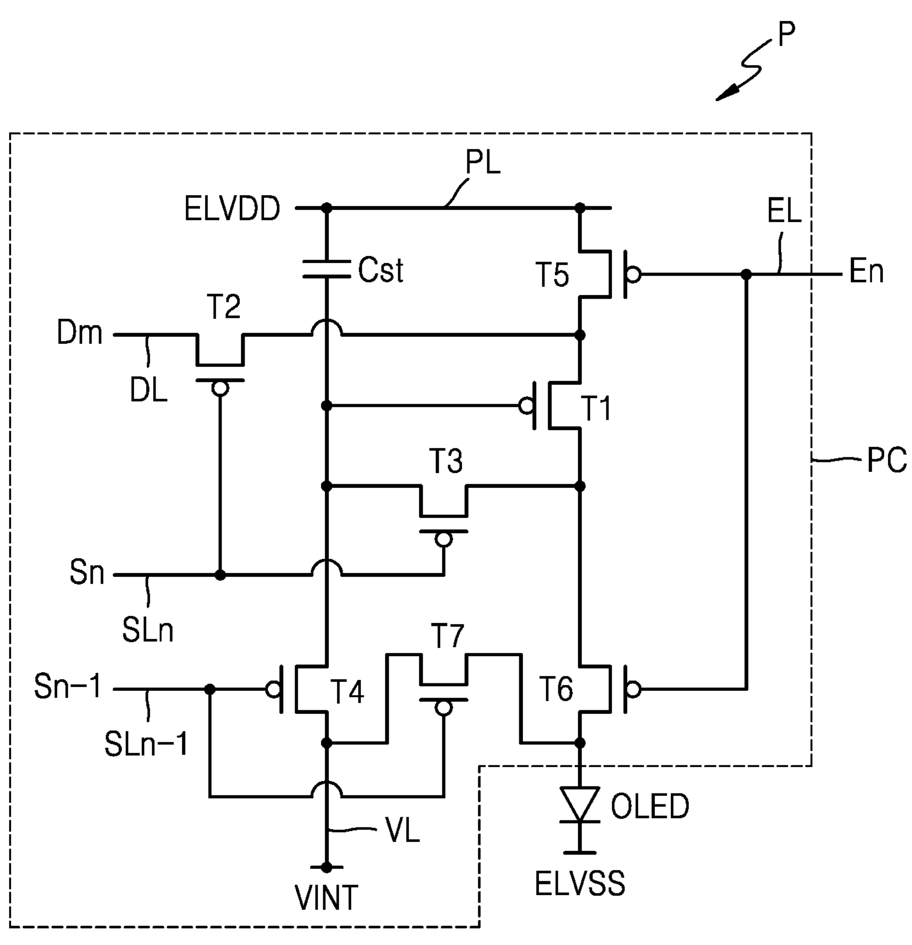

FIGS. 2A and 2B are equivalent circuit diagrams illustrating a light-emitting diode included in a display apparatus DV and a pixel circuit PC which is electrically connected to the light-emitting diode, according to an embodiment.

Referring to FIG. 2A, each sub-pixel P includes a pixel circuit PC connected to a scan line SL and a data line DL, and an organic light-emitting diode OLED as a light-emitting element which is connected to the pixel circuit PC.

The pixel circuit PC includes a driving thin-film transistor T1, a switching thin-film transistor T2, and a storage capacitor Cst. The switching thin-film transistor T2 transmits a data signal Dm input through the data line DL according to a scan signal Sn input through the scan line SL to the driving thin-film transistor T1.

The storage capacitor Cst is connected to the switching thin-film transistor T2 and the driving voltage line PL, and stores a voltage corresponding to a difference between a voltage received from the switching thin-film transistor T2 and a first power supply voltage ELVDD (or a driving voltage) supplied to the driving voltage line PL.

The driving thin-film transistor T1 may be connected to the driving voltage line PL and the storage capacitor Cst, and may control driving current (e.g., electrical current) flowing through the organic light-emitting diode OLED from the driving voltage line PL in response to a value of the voltage stored in the storage capacitor Cst. The organic light-emitting diode OLED may emit light having a certain luminance due to the driving current.

Although the pixel circuit PC includes two thin-film transistors and one storage capacitor in FIG. 2A, the disclosure is not limited thereto.

Referring to FIG. 2B, the pixel circuit PC may include the driving and switching thin-film transistors T1 and T2, a compensation thin-film transistor T3, a first initialization thin-film transistor T4, a first emission control thin-film transistor T5, a second emission control thin-film transistor T6, and a second initialization thin-film transistor T7.

Although each sub-pixel P includes signal lines (e.g., SLn, SLn−1, EL, and DL), an initialization voltage line VL, and the driving voltage line PL in FIG. 2B, the disclosure is not limited thereto. As another example, at least one of the signal lines (e.g., SLn, SLn−1, EL, and DL), and/or the initialization voltage line VL may be shared by neighboring pixels.

A drain electrode of the driving thin-film transistor T1 may be electrically connected to the organic light-emitting diode OLED via the second emission control thin-film transistor T6. The driving thin-film transistor T1 receives a data signal Dm and supplies driving current to the main organic light-emitting diode OLED according to a switching operation of the switching thin-film transistor T2.

A gate electrode of the switching thin-film transistor T2 is connected to a first scan line SLn, and a source electrode of the switching thin-film transistor T2 is connected to the data line DL. A drain electrode of the switching thin-film transistor T2 may be connected to a source electrode of the driving thin-film transistor T1, and may be connected to the driving voltage line PL via the first emission control thin-film transistor T5.

The switching thin-film transistor T2 is turned on according to a first scan signal Sn received through the first scan line SLn, and performs a switching operation of transmitting the data signal Dm received through the data line DL to the source electrode of the driving thin-film transistor T1.

A gate electrode of the compensation thin-film transistor T3 may be connected to the first scan line SLn. A source electrode of the compensation thin-film transistor T3 may be connected to the drain electrode of the driving thin-film transistor T1, and may be connected to a sub-pixel electrode of the organic light-emitting diode OLED via the second emission control thin-film transistor T6. A drain electrode of the compensation thin-film transistor T3 may be connected to one electrode of the storage capacitor Cst, a source electrode of the first initialization thin-film transistor T4, and a gate electrode of the driving thin-film transistor T1. The compensation thin-film transistor T3 is turned on according to the first scan signal Sn received through the first scan line SLn, and diode-connects the driving thin-film transistor T1 by connecting the gate electrode and the drain electrode of the driving thin-film transistor T1 to each other.

A gate electrode of the first initialization thin-film transistor T4 may be connected to a second scan line (previous scan line) SLn−1. A drain electrode of the first initialization thin-film transistor T4 may be connected to the initialization voltage line VL. The source electrode of the first initialization thin-film transistor T4 may be connected to one electrode of the storage capacitor Cst, the drain electrode of the compensation thin-film transistor T3, and the gate electrode of the driving thin-film transistor T1. The first initialization thin-film transistor T4 may be turned on according to a second scan signal Sn−1 received through the second scan line SLn−1, and may perform an initialization operation of initializing a voltage of the gate electrode of the driving thin-film transistor T1 by supplying an initialization voltage VINT to the gate electrode of the driving thin-film transistor T1.

A gate electrode of the first emission control thin-film transistor T5 may be connected to an emission control line EL. A source electrode of the first emission control thin-film transistor T5 may be connected to the driving voltage line PL. A drain electrode of the first emission control thin-film transistor T5 is connected to the source electrode of the driving thin-film transistor T1 and the drain electrode of the switching thin-film transistor T2.

A gate electrode of the second emission control thin-film transistor T6 may be connected to the emission control line EL. A source electrode of the second emission control thin-film transistor T6 may be connected to the drain electrode of the driving thin-film transistor T1 and the source electrode of the compensation thin-film transistor T3. A drain electrode of the second emission control thin-film transistor T6 may be electrically connected to the sub-pixel electrode of the organic light-emitting diode OLED. The first emission control thin-film transistor T5 and the second emission control thin-film transistor T6 are simultaneously turned on according to an emission control signal En received through the emission control line EL, and thus, a first power supply voltage ELVDD is supplied to the organic light-emitting diode OLED and driving current flows through the organic light-emitting diode OLED.

A gate electrode of the second initialization thin-film transistor T7 may be connected to the second scan line SLn−1. A source electrode of the second initialization thin-film transistor T7 may be connected to the sub-pixel electrode of the organic light-emitting diode OLED. A drain electrode of the second initialization thin-film transistor T7 may be connected to the initialization voltage line VL. The second initialization thin-film transistor T7 may be turned on according to the second scan signal Sn−1 received through the second scan line SLn−1, and may initialize the sub-pixel electrode of the organic light-emitting diode OLED.

Although the first initialization thin-film transistor T4 and the second initialization thin-film transistor T7 are connected to the second scan line SLn−1 in FIG. 2B, the disclosure is not limited thereto. In another embodiment, the first initialization thin-film transistor T4 may be connected to the second scan line SLn−1 that is a previous scan line, to be driven according to the second scan signal Sn−1, and the second initialization thin-film transistor T7 may be connected to a separate signal line (e.g., a next scan line), to be driven according to a signal transmitted to the separate scan line.

The other electrode of the storage capacitor Cst may be connected to the driving voltage line PL. Any one electrode of the storage capacitor Cst may be connected to the gate electrode of the driving thin-film transistor T1, the drain electrode of the compensation thin-film transistor T3, and the source electrode of the first initialization thin-film transistor T4.

A counter electrode (e.g., a cathode) of the organic light-emitting diode OLED receives a second power supply voltage ELVSS (or a common power supply voltage). The organic light-emitting diode OLED receives driving current from the driving thin-film transistor T1 and emits light.

The pixel circuit PC is not limited to the number of thin-film transistors and storage capacitors and a circuit design described with reference to FIGS. 2A and 2B and the number and the circuit design may be modified in various ways. In another embodiment, the pixel circuit PC may include three thin-film transistors and a storage capacitor.

Figure 3A:
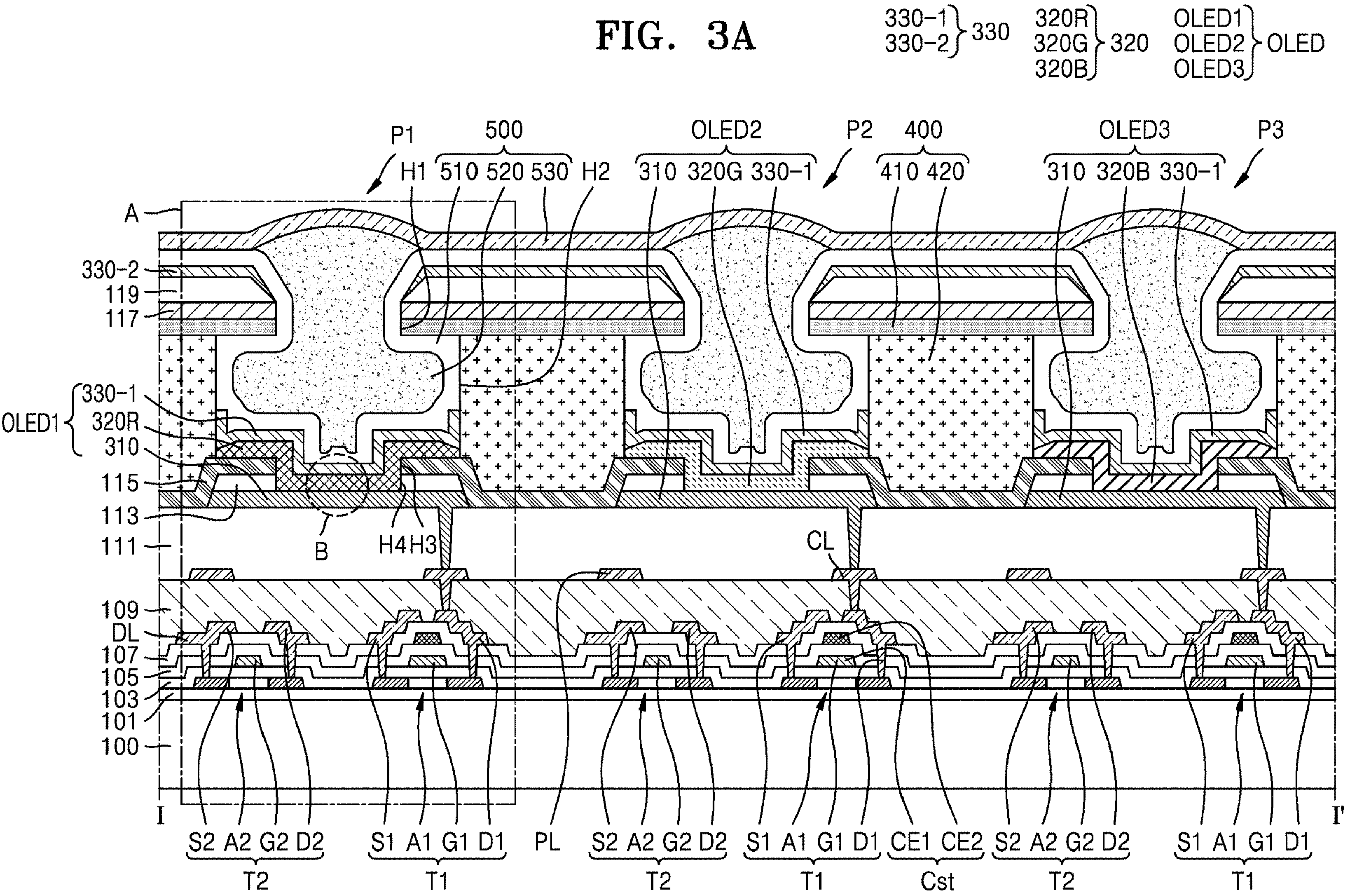
FIGS. 3A and 3B are a cross-sectional view taken along line I-I' of FIG. 1, and an enlarged view of portion B in FIG. 3A, respectively.
Figure 3B:
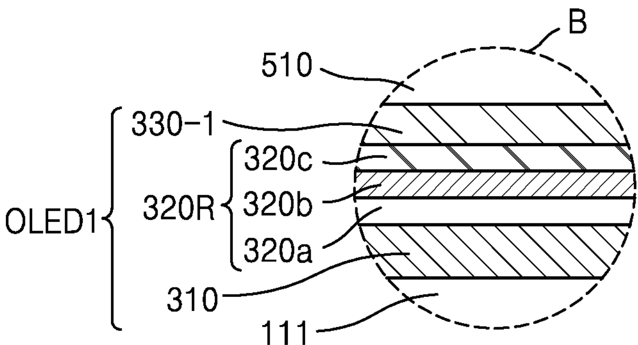

FIGS. 3A and 3B are a cross-sectional view taken along line I-I' of FIG. 1, and an enlarged view of portion B of FIG. 3A, respectively, and may be otherwise referred to as FIG. 3.

Referring to FIGS. 3A and 3B, each sub-pixel may include the driving thin-film transistor T1, the switching thin-film transistor T2, the storage capacitor Cst, and the organic light-emitting diode OLED. First, a buffer layer 101 is located on a substrate 100, and the driving thin-film transistor T1, the switching thin-film transistor T2, and the storage capacitor Cst are located on the buffer layer 101.

The substrate 100 may include any of various materials, for example, glass, a metal, or plastic. For example, the substrate 100 may be a flexible substrate including a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The buffer layer 101 formed of (or includes) silicon oxide (SiOx) and/or silicon nitride (SiNx) may be provided on the substrate 100 to prevent penetration of impurities.

The driving thin-film transistor T1 includes a driving semiconductor layer A1 and a driving gate electrode G1, and the switching thin-film transistor T2 includes a switching semiconductor layer A2 and a switching gate electrode G2. A first gate insulating layer 103 is located between the driving semiconductor layer A1 and the driving gate electrode G1 and between the switching semiconductor layer A2 and the switching gate electrode G2. The first gate insulating layer 103 may include an inorganic insulating material such as silicon oxide (SiOx), silicon nitride (SiNx), or silicon oxynitride (SiON).

Each of the driving semiconductor layer A1 and the switching semiconductor layer A2 may include amorphous silicon or polycrystalline silicon. In another embodiment, each of the driving semiconductor layer A1 and the switching semiconductor layer A2 may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn).

The driving semiconductor layer A1 may include a driving channel region overlapping the driving gate electrode G1 and not doped with impurities, and a driving source region and a driving drain region located on both sides (e.g., respectively at opposing sides) of the driving channel region and doped with impurities. A driving source electrode S1 and a driving drain electrode D1 may be respectively connected to the driving source region and the driving drain region.

The switching semiconductor layer A2 may include a switching channel region overlapping the switching gate electrode G2 and not doped with impurities, and a switching source region and a switching drain region located on both sides of the switching channel region and doped with impurities. A switching source electrode S2 and a switching drain electrode D2 may be respectively connected to the switching source region and the switching drain region.

Each of the driving gate electrode G1 and the switching gate electrode G2 may include molybdenum (Mo), aluminum (Al), copper (Cu), or titanium (Ti), and may have a single or multi-layer structure.

In some embodiments, the storage capacitor Cst may overlap (or correspond to) the driving thin-film transistor T1, along the thickness direction. In this case, the area (e.g., a planar area such as along the x-y plane) of the storage capacitor Cst and of the driving thin-film transistor T1 may increase, and a high-quality image may be provided. For example, the driving gate electrode G1 may be a first storage capacitor plate CE1 (e.g., a first electrode pattern) of the storage capacitor Cst. A second storage capacitor plate CE2 (e.g., a second electrode pattern) may overlap the first storage capacitor plate CE1 along the thickness direction, with a second gate insulating layer 105 therebetween. The second gate insulating layer 105 may include an inorganic insulating material such as silicon oxide (SiOx), silicon nitride (SiNx), or silicon oxynitride (SiON).

The driving thin-film transistor T1, the switching thin-film transistor T2, and the storage capacitor Cst may be covered by an interlayer insulating layer 107.

The interlayer insulating layer 107 may be an inorganic layer such as silicon oxynitride (SiON), silicon oxide (SiOx), and/or silicon nitride (SiNx).

The data line DL is located on the interlayer insulating layer 107, and the data line DL is connected to the switching semiconductor layer A2 of the switching thin-film transistor T2, through (or at) a contact hole passing through the interlayer insulating layer 107. The data line DL may function as the switching source electrode S2.

The driving source electrode S1, the driving drain electrode D1, the switching source electrode S2, and the switching drain electrode D2 may be located on the interlayer insulating layer 107, along with the data line DL, and may be connected to the driving semiconductor layer A1 or the switching semiconductor layer A2, through a contact hole passing through the interlayer insulating layer 107.

The data line DL, the driving source electrode S1, the driving drain electrode D1, the switching source electrode S2, and the switching drain electrode D2 may be covered by a first planarization film 109.

The driving voltage line PL and the data line DL may be located on (or in) different layers from each other. When 'A and B are located on different layers', it means that at least one layer (such as an insulating layer) is located between A and B, so that one of A and B is located under the at least one insulating layer (e.g., closer to a base substrate, for example) and the other of A and B is located over the at least one insulating layer (e.g., further from the base substrate, for example). The first planarization film 109 may be located between the driving voltage line PL and the data line DL, and the driving voltage line PL may be covered by a second planarization film 111.

The driving voltage line PL may be a pattern of a single-layer film or a multi-layer film including at least one of aluminum (Al), copper (Cu), titanium (Ti), and an alloy thereof. In an embodiment, the driving voltage line PL may be a three-layer film including Ti/Al/Ti.

Although the driving voltage line PL is located on the first planarization film 109 in FIG. 3A, the disclosure is not limited thereto. In another embodiment, the driving voltage line PL may reduce resistance (e.g., electrical resistance) by being connected to a lower additional voltage line (not shown) formed on (or provided on) the same layer as the data line DL, through a through-hole (not shown) formed in the first planarization film 109. As being in a same layer, elements may be formed in a same process and/or as including a same material as each other, elements may be as respective portions (or patterns) of a same material layer, may be on a same layer by forming an interface with a same underlying or overlying layer, etc., without being limited thereto.

Each of the first planarization film 109 and the second planarization film 111 may be a single or multi-layer film.

Each of the first planarization film 109 and the second planarization film 111 may include an organic insulating material. For example, the organic insulating material may include an imide-based polymer, a general-purpose polymer such as polymethyl methacrylate (PMMA) or polystyrene (PS), a polymer derivative having a phenol-based group, an acrylic polymer, an aryl ether-based polymer, an amide-based polymer, a fluorinated polymer, a p-xylene-based polymer, or a vinyl alcohol-based polymer.

Also, each of the first planarization film 109 and the second planarization film 111 may include an inorganic insulating material. For example, the inorganic insulating material may include silicon oxynitride (SiON), silicon oxide (SiOx), or silicon nitride (SiNx).

The organic light-emitting diode OLED including a sub-pixel electrode 310 (or a first electrode), a counter electrode 330 (or a second electrode), and an intermediate layer 320 including an emission layer **320*b* between the sub-pixel electrode 310 and the counter electrode 330, may be located on the second planarization film 111 as a light-emitting element. The organic light-emitting diode OLED may be provided in plural including a plurality of light-emitting elements including a first organic light-emitting diode OLED1 emitting red light, a second organic light-emitting diode OLED2 emitting green light, and a third organic light-emitting diode OLED3** emitting blue light.

The sub-pixel electrode 310 is connected to a connection wiring CL formed on (or provided on) the first planarization film 109, and the connection wiring CL is connected to the driving drain electrode D1 of the driving thin-film transistor T1. That is the light-emitting element may be connected to the respective transistor, at the drain thereof, via a connecting element (e.g., the connection wiring CL), without being limited thereto.

The sub-pixel electrode 310 may be a transparent electrode or a reflective electrode.

When the sub-pixel electrode 310 is a transparent electrode, the sub-pixel electrode 310 may include a transparent conductive layer. The transparent conductive layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO). In this case, the sub-pixel electrode 310 may further include a transflective layer for improving light efficiency, in addition to the transparent conductive layer. The transflective layer may be formed as a thin film having a thickness ranging from several micrometers (μm) to tens of micrometers (μm) and including at least one selected from silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and ytterbium (Yb).

When the sub-pixel electrode 310 is a reflective electrode, the sub-pixel electrode 310 may include a reflective film formed of Ag, Mg, Al, Pt, Pd, Au, Ni, Nd, Ir, Cr, or a combination thereof, and a transparent conductive layer located over and/or under the reflective film. The transparent conductive layer may include at least one selected from ITO, IZO, ZnO, $In_2O_3$, IGO, and AZO.

However, the disclosure is not limited thereto, and various modifications may be made. For example, the sub-pixel electrode 310 may be formed of any of various materials and may have a single or multi-layer structure.

A first insulating layer 115 may be located on the sub-pixel electrode 310.

The first insulating layer 115 may have (or define) an opening through which the sub-pixel electrode 310 is exposed to outside the first insulating layer 115, to define an emission area (e.g., a light emission area) of the organic light-emitting diode OLED. Although an 'opening' may include a through-hole and a blind hole, hereinafter, the opening may be referred to as a through-hole. The first insulating layer 115 may overlap an edge of the sub-pixel electrode 310. That is, the first insulating layer 115 may not be located in the emission area of the organic light-emitting diode OLED. In detail, the first insulating layer 115 may include (or define) a third hole H3 corresponding to the emission area of the organic light-emitting diode OLED. The first insulating layer 115 may cover an edge of the sub-pixel electrode 310, and may extend to a non-pixel area which is adjacent to the emission area within the sub-pixel P. That is, the first insulating layer 115 may extend from an edge of the sub-pixel electrode 310 of the first sub-pixel P1, to an edge of the sub-pixel electrode 310 of the second sub-pixel P2, along or through the non-pixel area between the sub-pixels P in a direction along the substrate 100. Alternatively, the first insulating layer 115 may extend from an edge of the sub-pixel electrode 310 of the second sub-pixel P2, to an edge of the sub-pixel electrode 310 of the third sub-pixel P3, through the non-pixel area.

The first insulating layer 115 may include an inorganic insulating material. For example, the inorganic insulating material may include silicon oxynitride (SiON), silicon oxide (SiOx), or silicon nitride (SiNx). However, the disclosure is not limited thereto, and the first insulating layer 115 may include an organic insulating material. For example, the organic insulating material may include an imide-based polymer, a general-purpose polymer such as polymethyl methacrylate (PMMA) or polystyrene (PS), a polymer derivative having a phenol-based group, an acrylic polymer, an aryl ether-based polymer, an amide-based polymer, a fluorinated polymer, a p-xylene-based polymer, or a vinyl alcohol-based polymer. However, when the first insulating layer 115 is formed of an inorganic insulating material, outgassing from an organic material may be prevented, which may help extend a lifespan of the organic light-emitting diode OLED.

A first protective layer 113 may be located between the sub-pixel electrode 310 and the first insulating layer 115. The first protective layer 113 may protect the sub-pixel electrode 310 from damage that may occur in a process of forming (or providing) a hole (e.g., a contact hole or a via hole) in the first insulating layer 115 and a metal stacked structure 400 described below. Accordingly, a bottom surface of the first protective layer 113 which is closest to the substrate 100 (or the sub-pixel electrode 310) may contact the sub-pixel electrode 310, and a top surface of the first protective layer 113 which is furthest from the substrate 100 (or the sub-pixel electrode 310) may contact the first insulating layer 115. Also, the first protective layer 113 may have an opening through which the sub-pixel electrode 310 is exposed (e.g., to outside the first protective layer 113), like the first insulating layer 115, to define the emission area of the organic light-emitting diode OLED together with the third hole H3. That is, the first protective layer 113 may not be located in the emission area of the organic light-emitting diode OLED, and may be located at an edge of the sub-pixel electrode 310. In detail, the first protective layer 113 may include a fourth hole H4 having a planar dimension, such as a diameter) that is the same as or similar to a dimension of the third hole H3 of the first insulating layer 115, in the plan view.

The first protective layer 113 may include a transparent conductive oxide (TCO). In detail, the TCO of the first protective layer 113 may include at least one selected from among indium tin oxide (ITO), indium zinc oxide (IZO), zinc oxide (ZnO), indium oxide ($In_2O_3$), indium gallium oxide (IGO), and aluminum zinc oxide (AZO). In an embodiment, the first protective layer 113 may include an amorphous TCO. For example, the amorphous TCO of the first protective layer 113 may be amorphous indium tin oxide (a-ITO), amorphous indium zinc oxide (a-IZO), amorphous indium zinc tin oxide (a-ITZO), or amorphous aluminum zinc oxide (a-AZO).

In the non-pixel area which is between adjacent sub-pixels, the metal stacked structure 400 including a plurality of sub-metal layers, may be located on the first insulating layer 115. The metal stacked structure 400 may be electrically connected to a power supply voltage line surrounding a part of the display area DA (see FIG. 1), and may provide a second power supply voltage ELVSS (or a common power supply voltage, FIGS. 2A and 2B) which is transmitted by the power supply voltage line, to the various sub-pixels. The metal stacked structure 400 may also be referred to as a conductive stacked structure. Accordingly, the metal stacked structure 400 may be located in or form a mesh pattern in a plan view. The mesh pattern may include a solid portion where material of the metal stacked structure 400 is present, and gaps within the solid portion where the material is absent. In other words, the metal stacked structure 400 (e.g., the solid portion thereof) may surround each of the sub-pixels P, for example, the first through third sub-pixels P1, P2, and P3, in a plan view.

The metal stacked structure 400 may include a first sub-metal layer 410 and a second sub-metal layer 420 which is located under the first sub-metal layer 410. Alternatively, the metal stacked structure 400 may include the first sub-metal layer 410, the second sub-metal layer 420, and a third sub-metal layer (not shown) located under the second sub-metal layer 420. However, the third sub-metal layer (not shown) is not necessarily included, and the second sub-metal layer 420 may be located directly on the first insulating layer 115, such as to contact the first insulating layer 115. As being in contact, elements may form an interface therebetween, without being limited thereto.

Etch rates of materials respectively providing the plurality of sub-metal layers of the metal stacked structure 400 may be different from each other. In detail, the first sub-metal layer 410 and the second sub-metal layer 420 may include materials having different etch rates from each other. When the metal stacked structure 400 includes the third sub-metal layer (not shown), the third sub-metal layer (not shown) may include the same material and/or may have the same etch rate as that of the first sub-metal layer 410. In an embodiment, the first sub-metal layer 410 may be a metal layer including titanium (Ti), and the second sub-metal layer 420 may be a metal layer including aluminum (Al). That is, the metal stacked structure 400 may be a structure in which the second sub-metal layer 420 including aluminum (Al) and the first sub-metal layer 410 including titanium (Ti) are sequentially stacked, in a direction away from the light-emitting element structure. Alternatively, the metal stacked structure 400 may be a structure in which the third sub-metal layer (not shown) including titanium (Ti), the second sub-metal layer 420 including aluminum (Al), and the first sub-metal layer 410 including titanium (Ti) are sequentially stacked.

The metal stacked structure 400 may have (or define) an opening through which the sub-pixel electrode 310 is exposed to outside the solid portion of the metal stacked structure 400, like the holes of the first insulating layer 115 and the first protective layer 113. The metal stacked structure 400 may not be located in the emission area of the organic light-emitting diode OLED. In detail, the first sub-metal layer 410 may include a first hole H1 at the first sub-metal layer 410 and corresponding to the emission area of the organic light-emitting diode OLED. A dimension such as a diameter of the first hole H1 of the first sub-metal layer 410 may be substantially the same as or similar to a dimension such as a diameter of the third hole H3 of the first insulating layer 115. The first hole H1 may correspond to and/or be aligned with the third hole H3, without being limited thereto. However, since the first sub-metal layer 410 and the second sub-metal layer 420 may include materials having different etch rates, the second sub-metal layer 420 may include a second hole H2 at the second sub-metal layer 420 and overlapping the first hole H1 of the first sub-metal layer 410 and having a diameter (e.g., a dimension) greater than that of the first hole H1. The first hole H1 together with the second hole H2 may together define a metal layer hole.

An edge (or sidewall) of the first sub-metal layer 410 which defines the first hole H1 may protrude more toward the center of the first hole H1 than an edge of the second sub-metal layer 420 defining the second hole H2, to form an under-cut structure. Here, a side surface of the first sub-metal layer 410 defines the first hole H1 and a side surface of the second sub-metal layer 420 defines the second hole H2, the first hole H1 has a center, and the side surface of the first sub-metal layer 410 is closer to the center of the first hole H1 than the side surface of the second sub-metal layer 420. That is, in the metal stacked structure 400, since the second sub-metal layer 420 is etched more than the first sub-metal layer 410, a part of the first sub-metal layer 410 may protrude more than a side surface of the second sub-metal layer 420 to form a tip at the metal layer hole. A length of the tip of the first sub-metal layer 410, for example, a length from a point at which a side surface or sidewall of the second sub-metal layer 420 and a bottom surface of the first sub-metal layer 410 meet each other, to a protruding edge (or side surface) of the first sub-metal layer 410 which is furthest from the sidewall of the second sub-metal layer 420 as a distal end, may be about 2 μm or less. In some embodiments, a length of the tip (or extended portion) of the first sub-metal layer 410 may range from about 0.3 μm to about 1 μm, or from about 0.3 μm to about 0.7 μm.

A low-reflection layer 117 may be located on the metal stacked structure 400. The low-reflection layer 117 that includes a metal oxide having a surface reflectance lower than that of the metal stacked structure 400, for example, the first sub-metal layer 410, may reduce a reflectance of external light of a display apparatus DV (e.g., a reflection-reducing layer or anti-reflection layer). Since the first sub-metal layer 410 is an uppermost layer of the metal stacked structure 400, the low-reflection layer 117 may have a light reflectance lower than that of the first sub-metal layer 410 including titanium (Ti). The low-reflection layer 117 may have an opening through which the sub-pixel electrode 310 is exposed to outside the low-reflection layer 117, like the first sub-metal layer 410 of the metal stacked structure 400. The low-reflection layer 117 may not be located in the emission area of the organic light-emitting diode OLED. In detail, the low-reflection layer 117 may include a hole having a diameter that is the same as that of the first hole H1 of the first sub-metal layer 410. That is, portions of the low-reflection layer 117 may be spaced apart from each other with the emission area therebetween, by a diameter distance as a dimension of the first hole H1.

The low-reflection layer 117 may include a metal oxide having a high absorbance. Since the low-reflection layer 117 includes a metal oxide having a high absorbance, that is, a high extinction coefficient (k), a considerable amount of light incident on a surface may be absorbed by the low-reflection layer 117 to reduce a reflectance of external light to outside the display apparatus DV. Also, among unabsorbed incident light, light reflected from a surface of the low-reflection layer 117 and light reflected from an interface between the low-reflection layer 117 and a lower layer among layers closer to the substrate 100 than the low-reflection layer 117, may destructively interfere with each other by controlling a refractive index and/or a thickness of the low-reflection layer 117. Accordingly, a reflectance of external light may be further reduced by the low-reflection layer 117. In an embodiment, the low-reflection layer 117 may include at least one of copper oxide (CuO), calcium oxide (CaO), molybdenum oxide (MoOx), and zinc oxide (ZnO).

A bank layer 119 may be located on the low-reflection layer 117. Similar to other layers, the bank layer 119 may include solid portions of a bank layer material, together with openings define between adjacent solid portions. In an embodiment, a fine metal mask (FMM) may be used to deposit patterns of the intermediate layer 320 emitting different light among the first sub-pixel P1, the second sub-pixel P2, and the third sub-pixel P3 for each material, and the bank layer 119 may be located to support the FMM during providing of the intermediate layer patterns. In some embodiments, a spacer (not shown) including the same material as that of the bank layer 119 may be located on the bank layer 119, such as to protrude further than an upper surface of the bank layer 119 shown in FIG. 3A, and the spacer (not shown) may contact and support the FMM so as to prevent damage to elements within the display area DA due to sagging of the FMM.

Since the bank layer 119 is located on the low-reflection layer 117 located on the metal stacked structure 400, the bank layer 119 may have an opening through which the sub-pixel electrode 310 is exposed to outside the bank layer 119, like the first sub-metal layer 410 and the low-reflection layer 117. The bank layer 119 may not be located in the emission area of the organic light-emitting diode OLED. In detail, the bank layer 119 may include a hole having a diameter that is the same as that of the first hole H1 of the first sub-metal layer 410. That is, portions of the bank layer 119 may be spaced apart from each other with the emission area therebetween, by a diameter distance as a dimension of the first hole H1. In this case, the bank layer 119 may include an organic insulating material. Alternatively, the bank layer 119 may include an inorganic insulating material such as silicon nitride, silicon oxynitride, or silicon oxide.

The intermediate layer 320 may be located on the sub-pixel electrode 310. The intermediate layer 320 may include patterns which are separated over a plurality of organic light-emitting diodes OLED, to respectively correspond to a plurality of sub-pixel electrodes 310. The intermediate layer 320 may include a first intermediate layer 320R located in the first sub-pixel P1 and emitting red light, a second intermediate layer 320G located in the second sub-pixel P2 and emitting green light, and a third intermediate layer 320B located in the third sub-pixel P3 and emitting blue light. Also, each intermediate layer 320 includes the emission layer 320*b*. The intermediate layer 320 may include a first functional layer 320*a* located under the emission layer 320*b* and/or a second functional layer 320*c* located over the emission layer 320*b*. The emission layer 320*b* may include a high molecular weight organic material or a low molecular weight organic material emitting light of a certain color.

The first functional layer 320*a* may have a single or multi-layer structure. For example, when the first functional layer 320*a* is formed of (or includes) a high molecular weight material, the first functional layer 320*a* may include a hole transport layer (HTL) having a single-layer structure and may be formed of poly-(3,4)-ethylene-dihydroxythiophene (PEDOT) or polyaniline (PANI). When the first functional layer 320*a* is formed of a low molecular weight material, the first functional layer 320*a* may include a hole injection layer (HIL) and a hole transport layer (HTL).

The second functional layer 320*c* is not always provided. For example, when each of the first functional layer 320*a* and the emission layer 320*b* is formed of a high molecular weight material, the second functional layer 320*c* may not be formed. The second functional layer 320*c* may have a single or multi-layer structure. The second functional layer 320*c* may include an electron transport layer (ETL) and/or an electron injection layer (EIL).

The emission layer 320*b* of the intermediate layer 320 may be located for each sub-pixel P in the display area DA. The emission layers 320*b* of the first sub-pixel P1, the second sub-pixel P2, and the third sub-pixel P3 may emit light of different colors from each other. The emission layer 320*b* may be formed on the sub-pixel electrode 310 exposed through the opening of the first insulating layer 115. The intermediate layer 320 may be formed by using any of various methods, such as vacuum deposition.

The counter electrode 330 may be located on the intermediate layer 320. Portions or patterns of the counter electrode 330 may be individually separated over a plurality of organic light-emitting devices OLED to respectively correspond to a plurality of sub-pixel electrodes 310, like the intermediate layer 320. In this case, the patterns of the counter electrode 330 may be deposited on an entire surface, and may include a first portion 330-1 of the counter electrode 330 and a second portion 330-2 of the counter electrode 330 which are separated from each other. That is, taking dimensions (e.g., along the x-y plane as a planar dimension) the first portions 330-1 and the second portions 330-2 together, as arranged along the substrate 100, a planar area occupied by the counter electrode 330 may be equal to or greater than a planar area of an underlying layer such as the substrate 100.

The counter electrode 330 may be a transparent electrode or a reflective electrode. When the counter electrode 330 is a transparent electrode, the counter electrode 330 may include at least one material selected from among Ag, Al, Mg, Li, Ca, Cu, LiF/Ca, LiF/Al, MgAg, and CaAg, and may be formed as a thin film having a thickness ranging from several micrometers (μm) to tens of micrometers (μm).

When the counter electrode 330 is a reflective electrode, the counter electrode 330 may be formed of at least one selected from Ag, Al, Mg, Li, Ca, Cu, LiF/Ca, LiF/Al, MgAg, and CaAg. A configuration and a material of the counter electrode 330 are not limited thereto, and various modifications may be made.

However, the first hole H1 and the second hole H2 of the metal stacked structure 400 may be formed before a process of forming the counter electrode 330 of the organic light-emitting diode OLED. That is, portions or patterns of the counter electrode 330 of the organic light-emitting diode OLED may be separated by an under-cut structure of the metal stacked structure 400.

The counter electrode 330 may be disconnected by (or at) the first hole H1 and the second hole H2 of the metal stacked structure 400. In detail, the counter electrode 330 may include the first portion 330-1 and the second portion 330-2, and the first portion 330-1 of the counter electrode 330 may be located on the intermediate layer 320 within the first hole H1 and the second hole H2, and the second portion 330-2 of the counter electrode 330 may be located on the metal stacked structure 400 and spaced apart from the first portion 330-1 along the thickness direction. In particular, since the low-reflection layer 117 and the bank layer 119 are sequentially stacked on the metal stacked structure 400, and the counter electrode 330 is formed after deposition of the bank layer 119, the second portion 330-2 of the counter electrode 330 may be located on the bank layer 119. The second portion 330-2 may be extended along an upper surface of the bank layer 119 and along a side surface thereof.

That is, the first portion 330-1 of the counter electrode 330 may remain on a bottom surface of the first hole H1 and the second hole H2 (e.g., on an uppermost surface or innermost surface of a layer within the metal layer hole), and a plurality of the second portions 330-2 of the counter electrode 330 may be spaced apart from each other around the first hole H1 to be located on the metal stacked structure 400. Accordingly, the low-reflection layer 117, the bank layer 119, and the second portion 330-2 of the counter electrode may be sequentially stacked on the metal stacked structure 400.

The first portion 330-1 of the counter electrode 330 located in the first hole H1 and the second hole H2 may contact a side surface (or inner surface or sidewall) of the second sub-metal layer 420 of the metal stacked structure 400 which defines the second hole H2. That is, the first portion 330-1 of the counter electrode 330 may be electrically connected to the metal stacked structure 400. In this case, as described above, since the metal stacked structure 400 may be electrically connected to a power supply voltage line to provide the second power supply voltage ELVSS (or common power supply voltage), the first portion 330-1 of the counter electrode 330 may receive the second power supply voltage ELVSS.

Also, since the second sub-metal layer 420 of the metal stacked structure 400 has a structure including a hole having a diameter greater than that of the first sub-metal layer 410, a thickness of the second sub-metal layer 420 may be sufficiently ensured so that the first portion 330-1 of the counter electrode contacts the second sub-metal layer 420 of the metal stacked structure 400. That is, as a height of the metal stacked structure 400 increases, a thickness of the second sub-metal layer 420 should increase. In an embodiment, by considering incident angles of the intermediate layer 320 and the counter electrode 330, a thickness of the second sub-metal layer 420 may be greater than about ½ of a height (e.g., a total thickness) of the metal stacked structure 400. In an embodiment, when a height of the metal stacked structure 400 is about 0.5 μm, a thickness of the second sub-metal layer 420 may be at least about 0.29 μm. However, the disclosure is not limited thereto, and a thickness of the second sub-metal layer 420 may be freely determined as long as the first portion 330-1 of the counter electrode 330 may contact the second sub-metal layer 420.

A thin-film encapsulation layer 500 may be located on the organic light-emitting diode OLED, and may cover the organic light-emitting diode OLED. Since the first organic light-emitting diode OLED1, the second organic light-emitting diode OLED2, and the third organic light-emitting diode OLED3 may be easily damaged by external moisture or oxygen, the first organic light-emitting diode OLED1, the second organic light-emitting diode OLED2, and the third organic light-emitting diode OLED3 may be covered and protected by the thin-film encapsulation layer 500. The thin-film encapsulation layer 500 may cover the display area DA (e.g., be disposed on an entirety of the display area DA) and may extend to the outside of the display area DA, such as to the non-display area NDA.

The thin-film encapsulation layer 500 may include at least one organic encapsulation layer and at least one inorganic encapsulation layer. For example, the thin-film encapsulation layer 500 may include a first inorganic encapsulation layer 510, an organic encapsulation layer 520, and a second inorganic encapsulation layer 530. In this case, each of the first inorganic encapsulation layer 510 and the second inorganic encapsulation layer 530 may include at least one inorganic insulating material such as aluminum oxide, titanium oxide, tantalum oxide, hafnium oxide, zinc oxide, silicon oxide, silicon nitride, and silicon oxynitride. The organic encapsulation layer 520 may include a polymer-based material. Examples of the polymer-based material may include an acrylic resin, an epoxy resin, polyimide, and polyethylene.

Since the first inorganic encapsulation layer 510 extends along a structure which is under the first inorganic encapsulation layer 510, a top surface of the first inorganic encapsulation layer 510 may not be flat and may conform to a cross-sectional profile of the underlying structure. The organic encapsulation layer 520 may cover the first inorganic encapsulation layer 510, and unlike the first inorganic encapsulation layer 510, the organic encapsulation layer 520 may have a substantially flat top surface such as to planarize the first inorganic encapsulation layer 510. In detail, the first inorganic encapsulation layer 510 may extend along a top surface of the second portion 330-2 of the counter electrode, and in a direction toward the substrate 100 to cover a side surface of the metal stacked structure 400 together with a top surface of the first portion 330-1 of the counter electrode 330. The organic encapsulation layer 520 may be located to at least partially fill a volume of the first hole H1 and the second hole H2 formed for each sub-pixel. In other words, the organic encapsulation layer 520 may be located to correspond to each sub-pixel, and each pattern of the organic encapsulation layer 520 may have an isolated shape (e.g., a discrete shape) in a plan view. For example, the organic encapsulation layer 520 corresponding to the first through third sub-pixels P1, P2, and P3 may be spaced apart from each other in a direction along the substrate 100.

The second inorganic encapsulation layer 530 may be formed to cover the first inorganic encapsulation layer 510 and the organic encapsulation layer 520. However, the first inorganic encapsulation layer 510 and the second inorganic encapsulation layer 530 may contact each other, on the metal stacked structure 400. That is, since the organic encapsulation layer 520 fills a remaining volume of the first hole H1 and the second hole H2 formed for each sub-pixel and since a boundary is formed as a contact area between inorganic materials, a structure that is sealed for each sub-pixel may be formed.

The display apparatus DV according to an embodiment may provide a high-quality image and may reduce a reflectance of external light through the above structure. In the related art, since an FMM is used to deposit an intermediate layer, a foreign material or damage inevitably occurs in a bank layer 119 supporting the FMM, and thus, defects such as growth of dark spots may occur. However, in the display apparatus DV according to one or more embodiment of the invention, since the counter electrode 330 is disconnected by the metal stacked structure 400 including the under-cut structure, and since the thin-film encapsulation layer 500 seals the underlying structure for each sub-pixel, even when dark spots occur, growth of the dark spots may be suppressed, and thus, a high-quality image may be provided. Also, since the counter electrode 330 is disconnected by the metal stacked structure 400 to provide a plurality of disconnected portions, lateral leakage (electrical) current generated through an upper cavity layer of an existing bank layer may not be generated. Also, since the first portion 330-1 of the counter electrode is electrically connected to the second sub-metal layer 420 of the metal stacked structure 400, the second sub-metal layer 420 may be thicker than an existing wiring (e.g., another signal line or conductive line) that receives a second power supply voltage ELVSS, and thus, driving resistance (e.g., electrical driving resistance) may be reduced. However, when the metal stacked structure 400 is provided, a reflectance of external light may increase. Accordingly, the display apparatus according to an embodiment may allow the low-reflection layer 117 to be located on the metal stacked structure 400, to reduce a reflectance of external light, and improve image quality in a black image.

FIGS. 4A through 4K are cross-sectional views illustrating a process of manufacturing (or providing) a display apparatus DV, according to an embodiment. FIGS. 4A through 4K may correspond to portion A of FIG. 3A. That is, FIGS. 4A through 4K may be cross-sectional views illustrating a pixel area of the first sub-pixel P1 of the display apparatus, according to an embodiment, and such a process may be equally applied to the second sub-pixel P2 and the third sub-pixel P3.

Figure 4A:
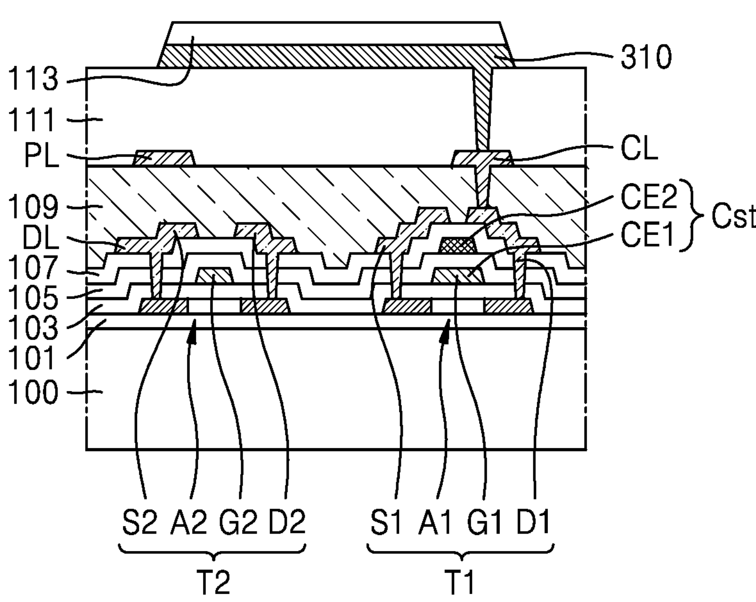
FIGS. 4A through 4K are cross-sectional views sequentially illustrating a process of manufacturing a display apparatus, according to an embodiment.

As shown in FIG. 4A, the driving thin-film transistor T1, the switching thin-film transistor T2, and the storage capacitor Cst may be covered by the first planarization film 109 and the second planarization film 111, and the sub-pixel electrode 310 may be formed (or provided) on the second planarization film 111. The first planarization film 109 and the second planarization film 111 may be located over the display area DA and the non-display area NDA. The sub-pixel electrode 310 may be located in a plurality of sub-pixels P located in the display area DA. The first protective layer 113 may be formed on the sub-pixel electrode 310. The first protective layer 113 may be formed not to deviate from a region where the sub-pixel electrode 310 is located. That is, the first protective layer 113 may include a plurality of protective patterns respectively corresponding to the sub-pixel electrode 310. In this case, the first protective layer 113 may include a TCO.

Figure 4B:
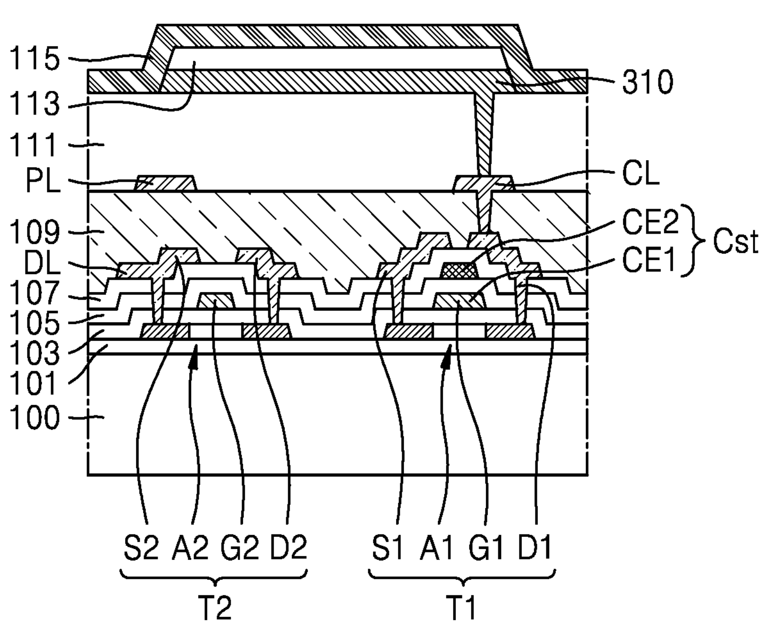

As shown in FIG. 4B, the first insulating layer 115 may be stacked on the sub-pixel electrode 310 and the first protective layer 113. The first insulating layer 115 may be located in the pixel area of the plurality of sub-pixels, where the pixel area may correspond to a light-emitting area, may be located to cover an edge of the sub-pixel electrode 310, and may extend to a non-pixel area which is adjacent to the pixel area (or between sub-pixels P). That is, the first insulating layer 115 may be formed in the entire display area DA (e.g., an entirety of the display area DA). In this case, the first insulating layer 115 may include an inorganic insulating material.

Figure 4C:
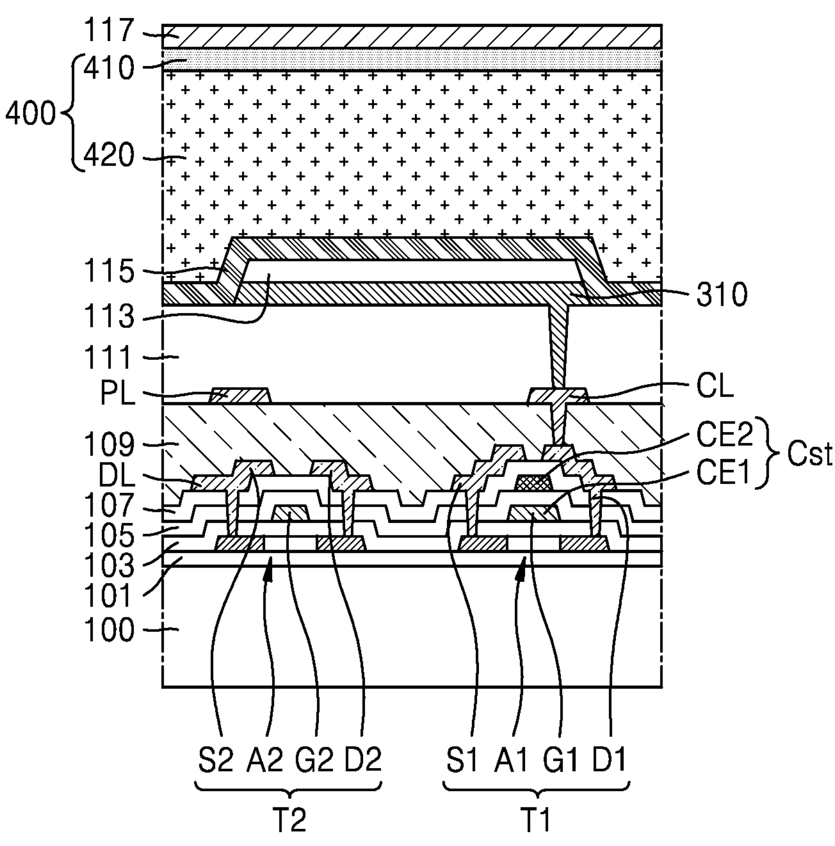

As shown in FIG. 4C, the metal stacked structure 400 and the low-reflection layer 117 may be formed on the first insulating layer 115. The metal stacked structure 400 may include the first sub-metal layer 410 and the second sub-metal layer 420, and the second sub-metal layer 420 and the first sub-metal layer 410 may be sequentially stacked on the first insulating layer 115. In this case, the first sub-metal layer 410 and the second sub-metal layer 420 may include materials having different etch rates from each other. In detail, the first sub-metal layer 410 may be a metal layer including titanium (Ti), and the second sub-metal layer 420 may be a metal layer including aluminum (Al).

The low-reflection layer 117 may be formed on the metal stacked structure 400 to be further from the substrate 100 than the metal stacked structure 400. The low-reflection layer 117 including a metal oxide having a surface reflectance lower than that of the metal stacked structure 400 may include at least one of copper oxide (CuO), calcium oxide (CaO), molybdenum oxide (MoOx), and zinc oxide (ZnO).

Figure 4D:
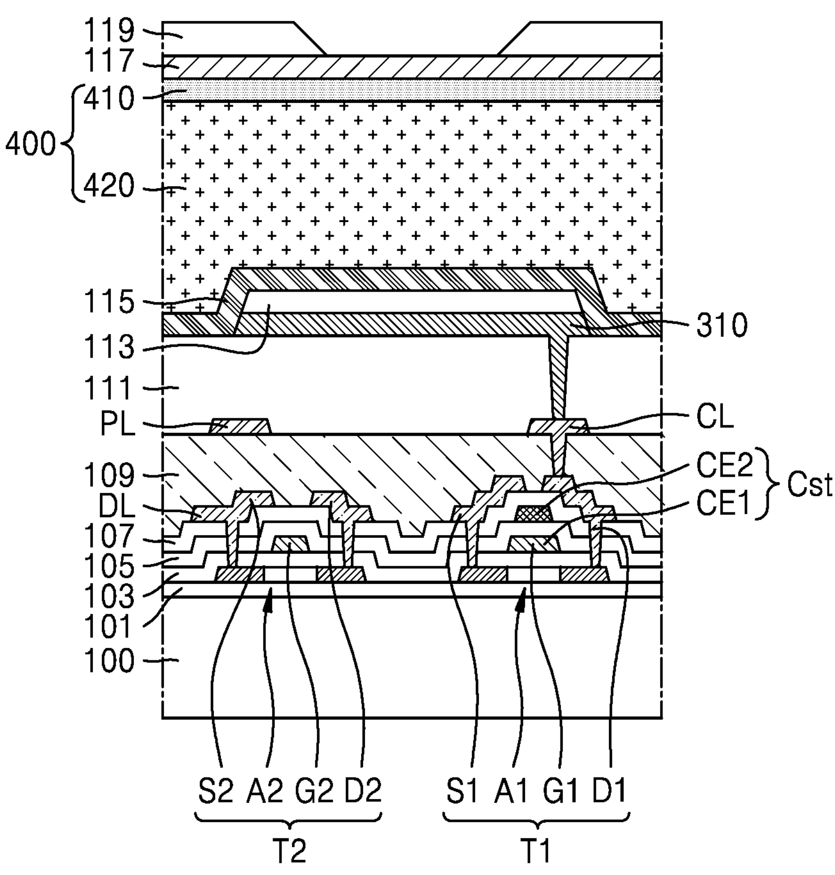

As shown in FIG. 4D, the bank layer 119 may be formed on the low-reflection layer 117. The bank layer 119 may be formed by entirely depositing an insulating film on the low-reflection layer 117 such that the insulating film material is provided on an entirety of the low-reflection layer 117, and then patterning the insulating film. In an embodiment, a photoresist may be first formed on the bank layer 119. The photoresist may include an opening corresponding to a position where the first hole H1 and the second hole H2 are to be formed. That is, the opening of the photoresist may overlap an emission area of the plurality of sub-pixels. A hole corresponding to the opening of the photoresist may be formed in the bank layer 119 by using the photoresist as a mask. The hole of the bank layer 119 may have a diameter that is the same as a diameter of the first hole H1 of the first sub-metal layer 410. The bank layer 119 may include an organic insulating material or an inorganic insulating material.

Figure 4E:
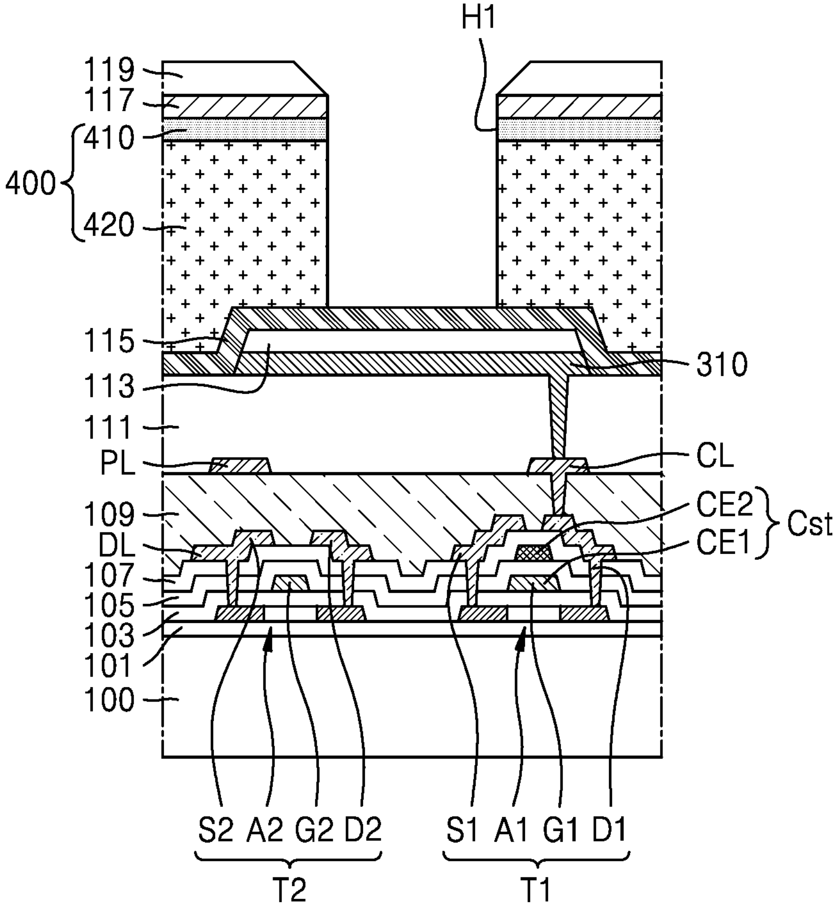

As shown in FIG. 4E, a hole corresponding to the opening of the photoresist may be formed in the low-reflection layer 117 and in the metal stacked structure 400, such as by using the photoresist as a mask. Accordingly, the metal stacked structure 400 may include (or define) the first hole H1 corresponding to the emission area of the plurality of sub-pixels P, and the low-reflection layer 117 may include a hole having a diameter that is the same as a diameter of the first hole H1. The photoresist may remain until the first hole H1 is completely formed, and may maintain a function as a patterning mask.

In a process of forming the first hole H1 of the first sub-metal layer 410 that is an uppermost layer of the metal stacked structure 400 relative to the substrate 100, portions of the sub-metal layers located under the first sub-metal layer 410 may also be removed. For example, the second sub-metal layer 420 may be removed together with the first sub-metal layer 410. When a third sub-metal layer (not shown) is included, the third sub-metal layer (not shown) as a lowermost layer may be removed together with the second sub-metal layer 420 and the first sub-metal layer 410. The first sub-metal layer 410 and the second sub-metal layer 420 may be removed at one time (or simultaneously), such as by using dry etching. That is, the first sub-metal layer 410 and the second sub-metal layer 420 may each include the first hole H1 as a preliminary hole, having a diameter that is the same as a diameter of the opening of the photoresist.

Figure 4F:
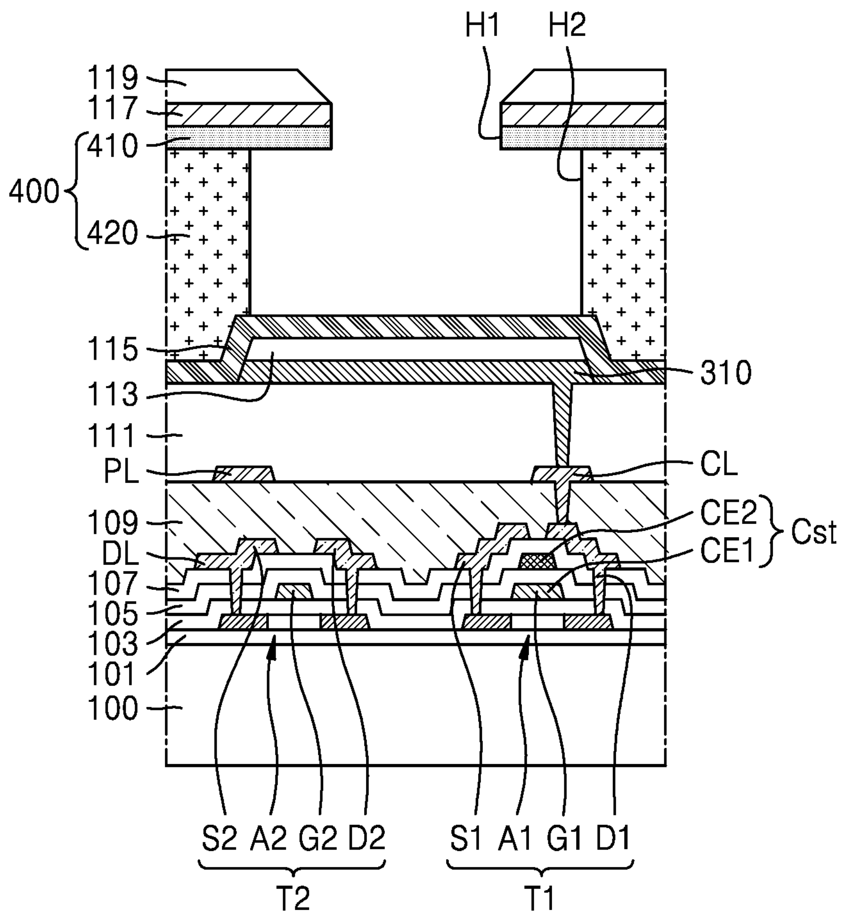

As shown in FIG. 4F, the second hole H2 overlapping the first hole H1 that is previously formed may be formed in the second sub-metal layer 420 of the metal stacked structure 400. In this process, in order to form an under-cut structure or an eaves structure, the second hole H2 having a diameter that is greater than that of the first hole H1 of the first sub-metal layer 410, may be formed in the second sub-metal layer 420. The second hole H2 of the second sub-metal layer 420 may be removed at one time, such as by using wet etching. Since the first sub-metal layer 410 and the second sub-metal layer 420 include materials having different etch rates, a diameter of the second hole H2 of the second sub-metal layer 420 may be increased from the preliminary first hole dimension (FIG. 4E) in the second sub-metal layer 420.

In detail, in an embodiment including a wet etching process, the first sub-metal layer 410 and the third sub-metal layer 430 each including titanium (Ti), may be less etched or not etched as compared to the etching of the second sub-metal layer 420, and the second sub-metal layer 420 including aluminum (Al) may be more etched. Since a final dimension of the second hole H2 is greater than a final dimension of the first hole H1 along a same direction, an edge or distal end of the first sub-metal layer 410 which defines the first hole H1 may protrude further toward the center of the first hole H1 than an edge or sidewall of the second sub-metal layer 420 which defines the second hole H2, to form a tip shape.

Figure 4G:
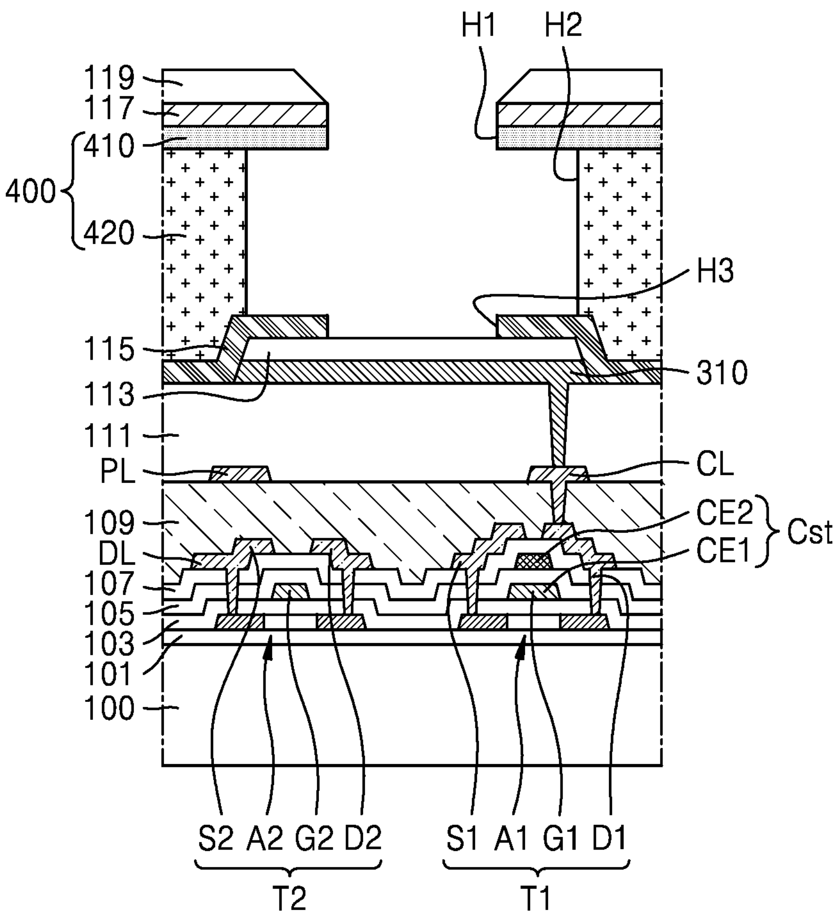

As shown in FIG. 4G, the third hole H3 corresponding to the opening of the photoresist may be formed in the first insulating layer 115, by using the photoresist as a mask. That is, a diameter of the third hole H3 of the first insulating layer 115 may be the same as a diameter of the first hole H1 of the first sub-metal layer 410, owing to the photoresist opening of the mask. In order to form the third hole H3 of the first insulating layer 115, a portion of the first insulating layer 115 may be removed, such as by using dry etching.

Figure 4H:
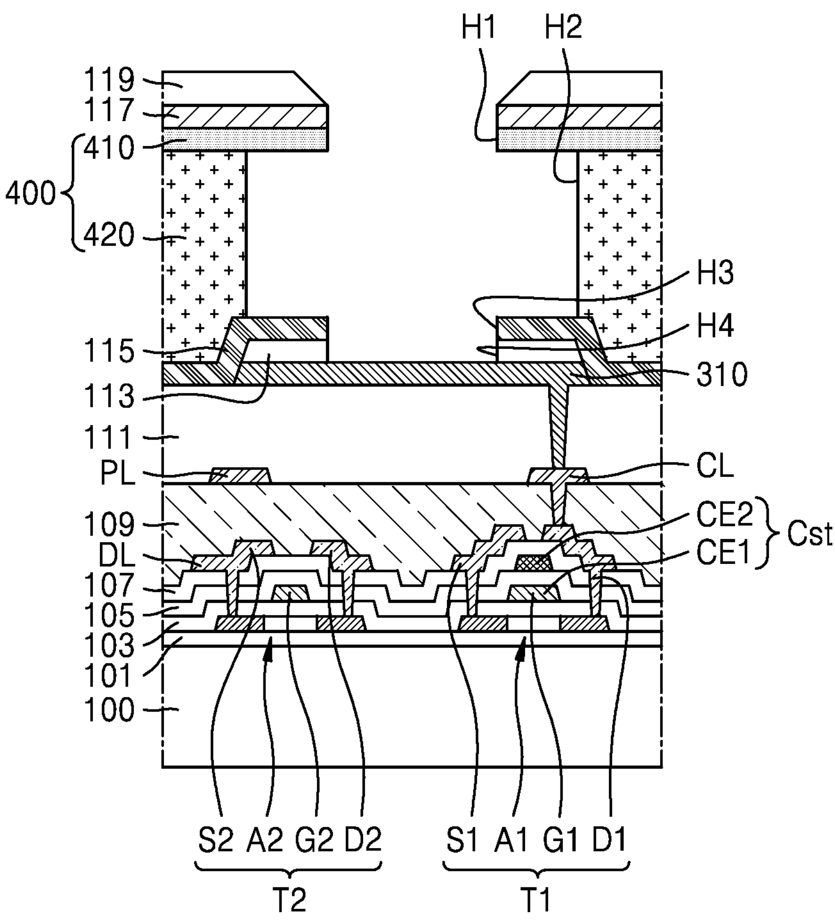

As shown in FIG. 4H, the fourth hole H4 corresponding to the same opening of the photoresist for forming the third hole H3, may be formed in the first protective layer 113 by using the photoresist as a mask. A diameter of the fourth hole H4 of the first protective layer 113 may be substantially the same as or slightly greater than a diameter of the first hole H1 of the first sub-metal layer 410 and the third hole H3 of the first insulating layer 115. In order to form the fourth hole H4 in the first protective layer 113, a portion of the first protective layer 113 may be removed, such as by using wet etching.

Figure 4I:
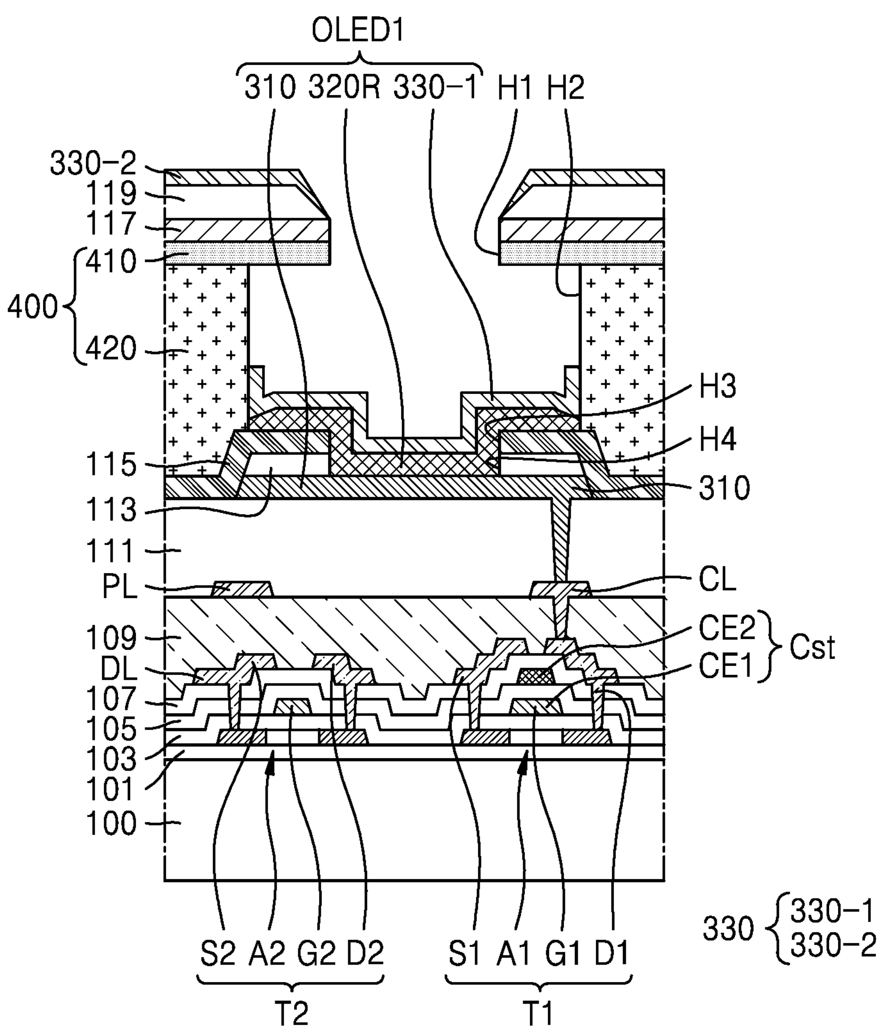

As shown in FIG. 4I, the photoresist may be removed, and in a process of forming the organic light-emitting diode OLED, the intermediate layer 320 and the counter electrode 330 may be sequentially stacked on the sub-pixel electrode 310. In this case, the intermediate layer 320 may be patterned to correspond to the sub-pixel electrode 310 for each sub-pixel P, such as by using an FMM. The intermediate layer 320 may be formed to remain at a lower portion of the first hole H1, the second hole H2, the third hole H3 and the fourth hole H4 of each sub-pixel. In contrast, although a counter electrode material providing the counter electrode 330 may be entirely deposited to cover an entirety of the underlying structure shown in FIG. 4H, for example, the counter electrode 330 may be separated or disconnected into portions spaced apart from each other along the underlying structure, by the under-cut structure of the metal stacked structure 400. For example, the first portion 330-1 of the counter electrode may be formed in the first hole H1 and the second hole H2 of the metal stacked structure 400, and the second portion 330-2 of the counter electrode may be formed on the bank layer 119 which is between the conductive stacked structure hole as the first hole H1 together with the second hole H2.

In particular, referring to FIG. 4I, the counter electrode 330 may be formed so that the second portion 330-2 contacts the second sub-metal layer 420 of the metal stacked structure 400, within the conductive stacked structure hole. In an embodiment, by considering a degree to which the first sub-metal layer 410 protrudes more toward the center than the second sub-metal layer 420, an angle at which the intermediate layer 320 and the first portion 330-1 of the counter electrode are deposited may be adjusted.

Figure 4J:
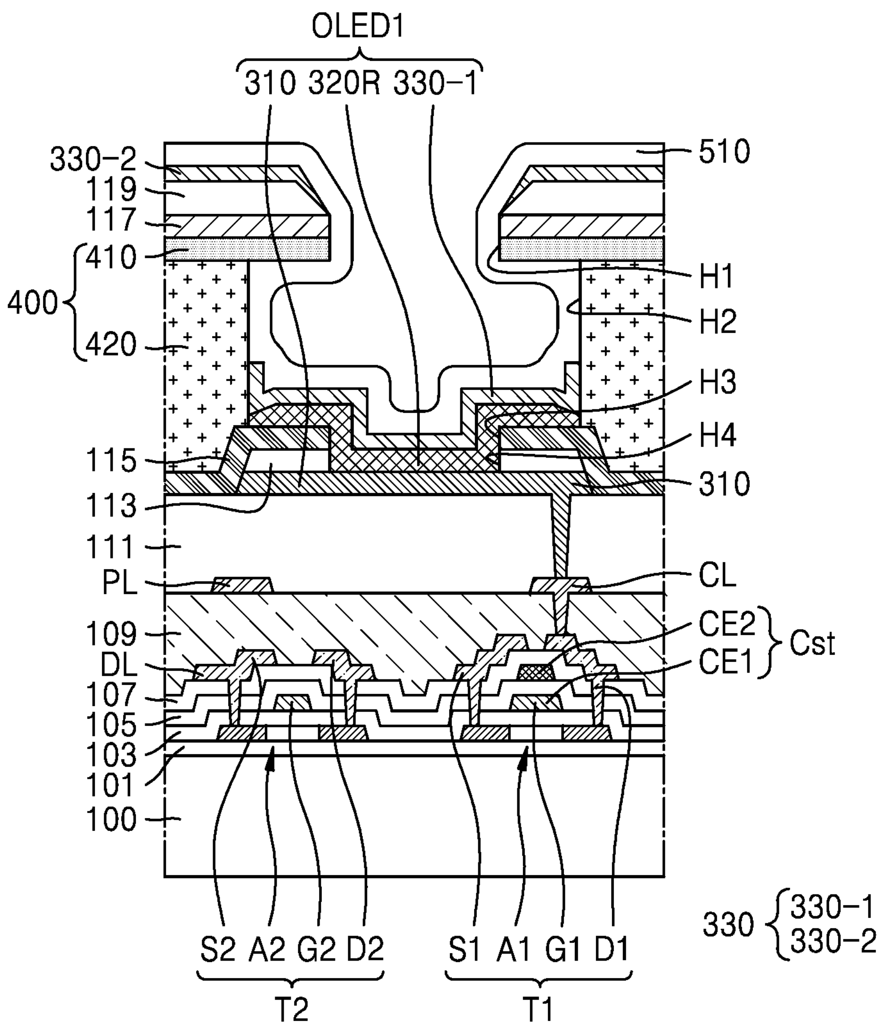

As shown in FIG. 4J, the first inorganic encapsulation layer 510 may be formed to cover the organic light-emitting diode OLED. The first inorganic encapsulation layer 510 may be formed by using chemical vapor deposition or the like. In this process, the first inorganic encapsulation layer 510 has a relatively excellent step coverage, and thus, may continuously cover a top surface of the second portion 330-2 of the counter electrode and inner surfaces of the first hole H1 and the second hole H2, without being disconnected. In an embodiment, referring to FIG. 3A, for example, the first inorganic encapsulation layer 510 may extend along the top surface of the second portion 330-2 of the counter electrode, along a side surface of the metal stacked structure 400 and along a top surface of the first portion 330-1 of the counter electrode 330, to be continuously and commonly disposed across sub-pixels P.

Figure 4K:
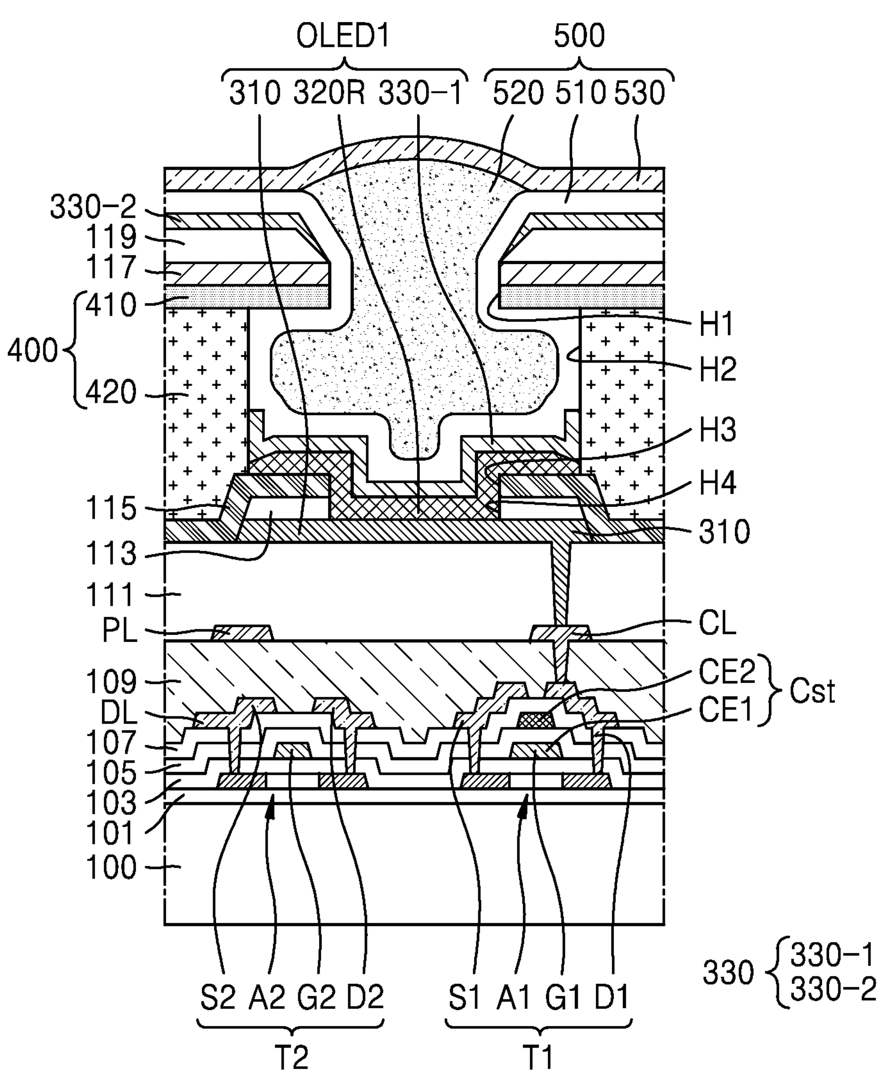

As shown in FIG. 4K, the organic encapsulation layer 520 and the second inorganic encapsulation layer 530 may be formed on the first inorganic encapsulation layer 510. The organic encapsulation layer 520 may be located to fill a remaining volume of the first hole H1 and the second hole H2 formed for each sub-pixel which is not occupied by the first inorganic encapsulation layer 510, and may planarize a top surface of the stacked structure on the substrate 100. The organic encapsulation layer 520 may include a polymer-based material. The organic encapsulation layer 520 may be formed by applying a polymer-based monomer by using an inkjet method or the like and then curing the monomer.

After the organic encapsulation layer 520 is formed, the second inorganic encapsulation layer 530 may be formed to cover the first inorganic encapsulation layer 510 and the organic encapsulation layer 520. In this case, the first inorganic encapsulation layer 510 and the second inorganic encapsulation layer 530 may contact each other, at positions corresponding to the metal stacked structure 400. The second inorganic encapsulation layer 530 may be formed by using chemical vapor deposition, like the first inorganic encapsulation layer 510.

As described above, in a display apparatus DV according to an embodiment, since a second electrode is separated or disconnected into portions spaced apart from each other along both a planar direction (x-y plane) and a thickness direction, by forming a metal stacked structure 400 including an under-cut structure and an encapsulation layer is sealed for each sub-pixel, growth of dark spots may be prevented. Also, since a low-reflection layer is located on solid portions of the metal stacked structure 400, a reflectance of external light may be reduced. These effects are examples, and do not limit the scope of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:

a substrate;

a thin-film transistor on the substrate;

a planarization film on the thin-film transistor;

a light-emitting element on the planarization film and connected to the thin-film transistor, the light-emitting element comprising a first electrode, an intermediate layer and a second electrode in order from the thin-film transistor;

an insulating layer overlapping an edge of the first electrode;

a metal stacked structure on the insulating layer, the metal stacked structure comprising:

a first sub-metal layer which defines a first hole corresponding to the first electrode, and a second sub-metal layer which is closer to the insulating layer than the first sub-metal layer and defines a second hole which corresponds to the first hole and has a dimension in a direction along the substrate which is greater than a dimension of the first hole; and a low-reflection layer located on the metal stacked structure, the second electrode comprising:

a first portion on the intermediate layer, and a second portion which is on the low-reflection layer and disconnected from the first portion at the metal stacked structure, wherein the metal stacked structure is directly connected to the second electrode of the light-emitting element at the second sub-metal layer of the metal stacked structure.

2. The display apparatus of claim 1, wherein a side surface of the first sub-metal layer defines the first hole and a side surface of the second sub-metal layer defines the second hole, the first hole has a center, and the side surface of the first sub-metal layer is closer to the center of the first hole than the side surface of the second sub-metal layer, in the direction along the substrate.

3. The display apparatus of claim 2, wherein within the second hole, the first portion of the second electrode contacts the side surface of the second sub-metal layer.

4. The display apparatus of claim 1, wherein the low-reflection layer comprises a metal oxide having a surface reflectance lower than a surface reflectance of the first sub-metal layer of the metal stacked structure.

5. The display apparatus of claim 4, wherein the low-reflection layer comprises copper oxide, calcium oxide, molybdenum oxide or zinc oxide.

6. The display apparatus of claim 1, further comprising a bank layer between the low-reflection layer and the second portion of the second electrode.

7. The display apparatus of claim 1, further comprising a protective layer between the first electrode and the insulating layer.

8. The display apparatus of claim 7, wherein the protective layer comprises a transparent conductive oxide.

9. The display apparatus of claim 1, further comprising a thin-film encapsulation layer on the second portion of the second electrode.

10. The display apparatus of claim 9, wherein a side surface of the metal stacked structure includes a side surface of the first sub-metal layer which defines the first hole, together with a side surface of the second sub-metal layer which defines the second hole, the first hole and the second hole together provide a hole in the metal stacked structure, and the thin-film encapsulation layer comprises:

a first inorganic encapsulation layer, an organic encapsulation layer and a second inorganic encapsulation layer in order from the substrate, the first inorganic encapsulation layer extending along the second portion of the second electrode, along the side surface of the metal stacked structure, and along the first portion of the second electrode, the organic encapsulation layer in the metal stacked structure, and the second inorganic encapsulation layer on the organic encapsulation layer.

11. The display apparatus of claim 10, wherein portions of the first inorganic encapsulation layer and the second inorganic encapsulation layer which are on the metal stacked structure, contact each other.

12. A method of providing a display apparatus, the method comprising:

providing a thin-film transistor, on a substrate;

providing a planarization film on the thin-film transistor;

providing, on the planarization film, a first electrode of a light-emitting element connected to the thin-film transistor;

providing an insulating layer overlapping an edge of the first electrode and defining a light emission area of the display apparatus;

providing a metal stacked structure on the insulating layer;

providing a low-reflection layer on the metal stacked structure; and providing a hole defined in the metal stacked structure and in the low-reflection layer, which corresponds to the first electrode; and after the providing of the hole in the metal stacked structure and in the low-reflection layer, providing an intermediate layer and a second electrode of the light-emitting element in the hole, wherein the second electrode comprises:

a first portion overlapping the first electrode and the intermediate layer, and a second portion which is on the low-reflection layer and disconnected from the first portion at the metal stacked structure.

13. The method of claim 12, further comprising providing a bank layer between the low-reflection layer and the second portion of the second electrode.

14. The method of claim 13, wherein the providing of the metal stacked structure comprises:

providing a first sub-metal layer and a second sub-metal layer which is closer to the insulating layer than the first sub-metal layer;

providing, in the first sub-metal layer, a first hole corresponding to the light emission area;

providing, in the second sub-metal layer, a second hole corresponding to the first hole; and providing the second hole having a dimension in a direction along the substrate which is greater than a dimension of the first hole.

15. The method of claim 14, wherein a side surface of the first sub-metal layer defines the first hole and a side surface of the second sub-metal layer defines the second hole, the first hole has a center, and the side surface of the first sub-metal layer is closer to the center of the first hole than the side surface of the second sub-metal layer.

16. The method of claim 14, further comprising providing, in the insulating layer, a third hole overlapping the first hole of the first sub-metal layer.

17. The method of claim 16, further comprising:

providing a protective layer between the insulating layer and the first electrode of the light- emitting element; and providing, in the protective layer, a fourth hole overlapping the first hole.

18. The method of claim 14, further comprising providing a thin-film encapsulation layer on the light-emitting element, wherein a side surface of the metal stacked structure includes a side surface of the first sub-metal layer which defines the first hole, together with a side surface of the second sub-metal layer which defines the second hole, the first hole and the second hole together provide a hole in the metal stacked structure, and the providing of the thin-film encapsulation layer comprises:

providing a first inorganic encapsulation layer extended along the second portion of the second electrode, along the side surface of the metal stacked structure, and along the first portion of the second electrode;

providing, on the first inorganic encapsulation layer, an organic encapsulation layer in the hole in the metal stacked structure;

providing, on the organic encapsulation layer, a second inorganic encapsulation layer; and providing portions of the first inorganic encapsulation layer and the second inorganic encapsulation layer contacting each other on the metal stacked structure.

* * * * *